US012813174B2

(12) United States Patent
Nakatani et al.

(10) Patent No.: US 12,813,174 B2
(45) Date of Patent: Nov. 24, 2026

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Kimihiko Nakatani, Toyama (JP); Takayuki Waseda, Toyama (JP); Shoma Miyata, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 500 days.

(21) Appl. No.: 18/357,293

(22) Filed: Jul. 24, 2023

(65) Prior Publication Data

US 2024/0096617 A1 Mar. 21, 2024

(30) Foreign Application Priority Data

Sep. 15, 2022 (JP) ................................. 2022-146815

(51) Int. Cl.
*H10P 14/60* (2026.01)
*C23C 16/44* (2006.01)
(Continued)

(52) U.S. Cl.
CPC ...... *H10P 14/6339* (2026.01); *C23C 16/4408* (2013.01); *C23C 16/52* (2013.01); *H10P 72/0402* (2026.01)

(58) Field of Classification Search
CPC ........ C23C 16/45523; C23C 16/45527; C23C 16/45534; H01L 21/32
See application file for complete search history.

(56) References Cited

U.S. PATENT DOCUMENTS

2001/0041250 A1* 11/2001 Werkhoven ........ H10D 64/0134 257/E21.279
2014/0287596 A1 9/2014 Hirose et al.
(Continued)

FOREIGN PATENT DOCUMENTS

JP 2014-183218 A 9/2014
JP 2017-222928 A 12/2017
(Continued)

OTHER PUBLICATIONS

Extended European Search Report issued on Jan. 23, 2024 for European Patent Application No. 23187187.2.
(Continued)

*Primary Examiner* — Joseph A Miller, Jr.
(74) *Attorney, Agent, or Firm* — Volpe Koenig

(57) ABSTRACT

There is provided a technique, which includes: (a) supplying a modifying agent to a substrate including a first surface and a second surface to form an inhibitor layer on the first surface and at least a portion of the second surface; and (b) forming a film on the second surface by performing a cycle a predetermined number of times, the cycle including (b1) supplying a precursor to the substrate and (b2) supplying a reactant to the substrate, wherein in (b), a process condition per cycle up to an n-th cycle is set to be different from a process condition per cycle on and after an (n+1)-th cycle, wherein n is an integer of 1 or 2 or more.

23 Claims, 13 Drawing Sheets

(51) Int. Cl.
*C23C 16/52* (2006.01)
*H10P 72/00* (2026.01)

(56) References Cited

U.S. PATENT DOCUMENTS

| | | | | |
|---|---|---|---|---|
| 2016/0148811 | A1* | 5/2016 | Nakatani | H01L 21/28088 438/652 |
| 2017/0342553 | A1 | 11/2017 | Yu et al. | |
| 2018/0033608 | A1* | 2/2018 | Miyahara | C23C 16/0236 |
| 2018/0166270 | A1 | 6/2018 | Cho et al. | |
| 2020/0303185 | A1 | 9/2020 | Nakagawa et al. | |
| 2020/0303186 | A1 | 9/2020 | Nakatani | |
| 2021/0098258 | A1 | 4/2021 | Degai et al. | |
| 2021/0202245 | A1 | 7/2021 | Waseda et al. | |
| 2021/0242023 | A1* | 8/2021 | Ogawa | C23C 16/34 |
| 2021/0272803 | A1* | 9/2021 | Nakatani | H01L 21/32 |

FOREIGN PATENT DOCUMENTS

| | | | |
|---|---|---|---|
| JP | 2020-155452 | A | 9/2020 |
| JP | 2020-155607 | A | 9/2020 |
| JP | 2021-106242 | A | 7/2021 |
| TW | 2020/04855 | A | 1/2020 |

OTHER PUBLICATIONS

Office Action issued on Jul. 17, 2024 for Taiwan Patent Application No. 112123047.

* cited by examiner

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2022-146815, filed on Sep. 15, 2022, the entire contents of which are incorporated herein by reference.

TECHNICAL FIELD

The present disclosure relates to a method of processing a substrate, a method of manufacturing a semiconductor device, a substrate processing apparatus, and a recording medium.

BACKGROUND

In the related art, as a process of manufacturing a semiconductor device, a process of selectively growing and forming a film on a specific surface among a plurality of types of surfaces in which materials exposed on the surface of a substrate are different (hereinafter, this process is also referred to as selective growth or selective film formation) may be carried out.

With the miniaturization of semiconductor devices, there is a strong demand for improvement in a step coverage of a film formed on a substrate during selective growth.

SUMMARY

Some embodiments of the present disclosure provide a technique capable of improving a step coverage of a film formed on a substrate by selective growth.

According to some embodiments of the present disclosure, there is provided a technique, which includes: (a) supplying a modifying agent to a substrate including a first surface and a second surface to form an inhibitor layer on the first surface and at least a portion of the second surface; and (b) forming a film on the second surface by performing a cycle a predetermined number of times, the cycle including (b1) supplying a precursor to the substrate and (b2) supplying a reactant to the substrate, wherein in (b), a process condition per cycle up to an n-th cycle is set to be different from a process condition per cycle on and after an (n+1)-th cycle, wherein n is an integer of 1 or 2 or more.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
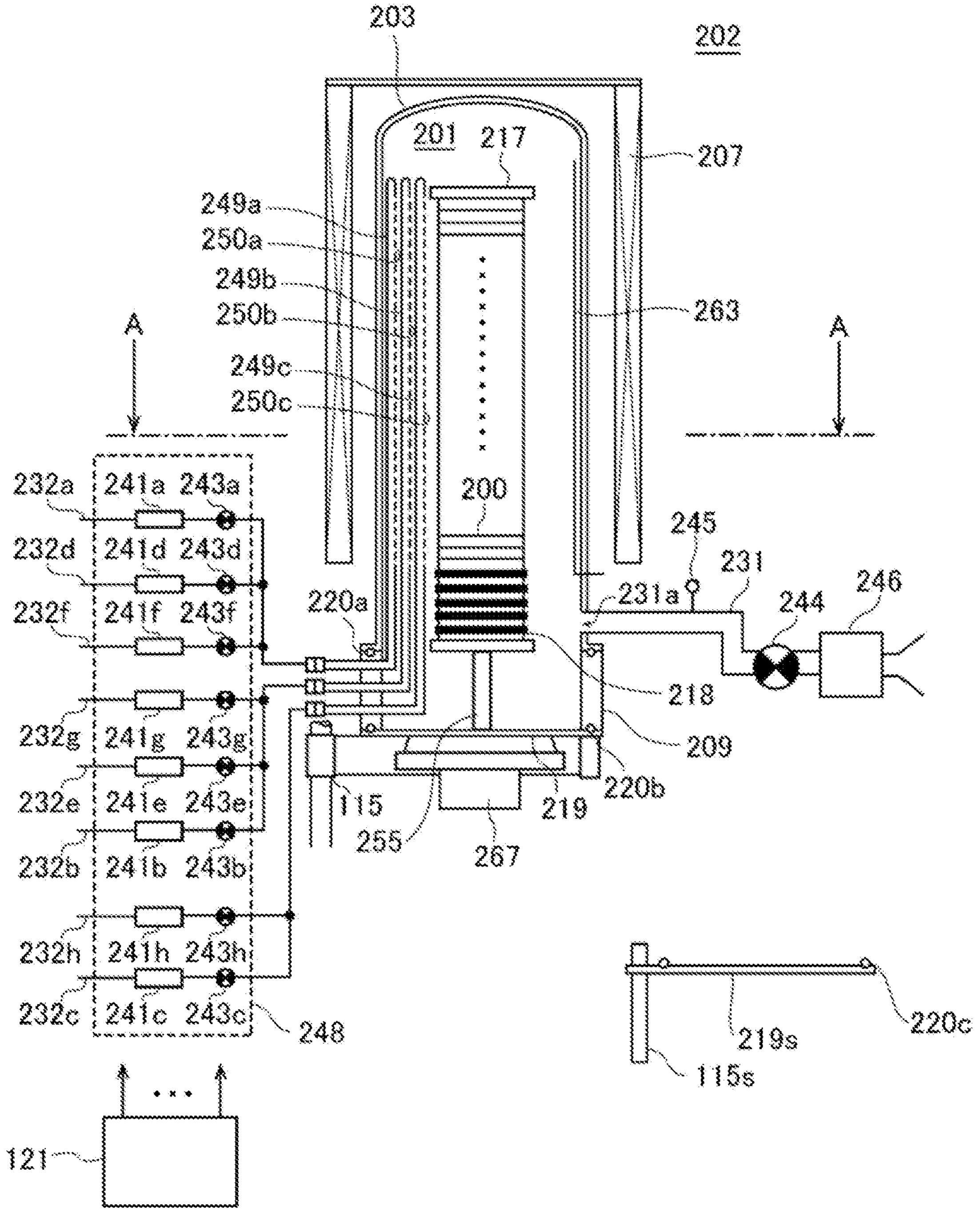
FIG. 1 is a schematic configuration view of a vertical process furnace of a substrate processing apparatus suitably used in embodiments of the present disclosure, in which a portion of a process furnace is shown in a vertical cross section.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Embodiments of the Present Disclosure

Hereinafter, some embodiments of the present disclosure will be described mainly with reference to FIGS. 1 to 4 and 5A to 5E. The drawings used in the following description are schematic, and dimensional relationships, ratios, and the like of various components shown in the drawings may not match actual ones. Further, dimensional relationships, ratios, and the like of various components among plural drawings may not match one another.

(1) Configuration of Substrate Processing Apparatus

As shown in FIG. 1, a process furnace 202 includes a heater 207 as a temperature regulator (a heating part). The heater 207 is formed in a cylindrical shape and is supported by a support plate so as to be vertically installed. The heater 207 also functions as an activator (an exciter) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and is formed in a cylindrical shape with its upper end closed and its lower end opened. A manifold 209 is disposed to be concentric with the reaction tube 203 under the reaction tube 203. The manifold 209 is made of, for example, a metal material such as stainless steel (SUS), and is formed in a cylindrical shape with both of its upper and lower ends opened. The upper end of the manifold 209 engages with the lower end of the reaction tube 203 so as to support the reaction tube 203. An O-ring 220*a* serving as a seal is provided between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical area of the process container. The process chamber 201 is configured to be capable of accommodating a plurality of wafers 200 as substrates. Processing on the wafers 200 is performed in the process chamber 201.

Nozzles 249*a* to 249*c* as first to third suppliers are installed in the process chamber 201 so as to penetrate a sidewall of the manifold 209. The nozzles 249*a* to 249*c* are also referred to as first to third nozzles, respectively. The nozzles 249*a* to 249*c* are made of, for example, a heat resistant material such as quartz or SiC. Gas supply pipes 232*a* to 232*c* are connected to the nozzles 249*a* to 249*c*, respectively. The nozzles 249*a* to 249*c* are different nozzles, and each of the nozzles 249*a* and 249*c* is provided adjacent to the nozzle 249*b*.

Mass flow controllers (MFCs) 241*a* to 241*c*, which are flow rate controllers (flow rate control parts), and valves 243*a* to 243*c*, which are opening/closing valves, are installed at the gas supply pipes 232*a* to 232*c*, respectively, sequentially from the upstream side of a gas flow. Each of gas supply pipes 232*d* and 232*f* is connected to the gas supply pipe 232*a* at the downstream side of the valves 243*a*. Each of gas supply pipes 232*e* and 232*g* is connected to the gas supply pipe 232*b* at the downstream side of the valves 243*b*. A gas supply pipe 232*h* is connected to the gas supply pipe 232*c* at the downstream side of the valves 243*c*. MFCs 241*d* to 241*h* and valves 243*d* to 243*h* are installed at the gas supply pipes 232*d* to 232*h*, respectively, sequentially from the upstream side of a gas flow. The gas supply pipes 232*a* to 232*h* are made of, for example, a metal material such as SUS.

Figure 2:
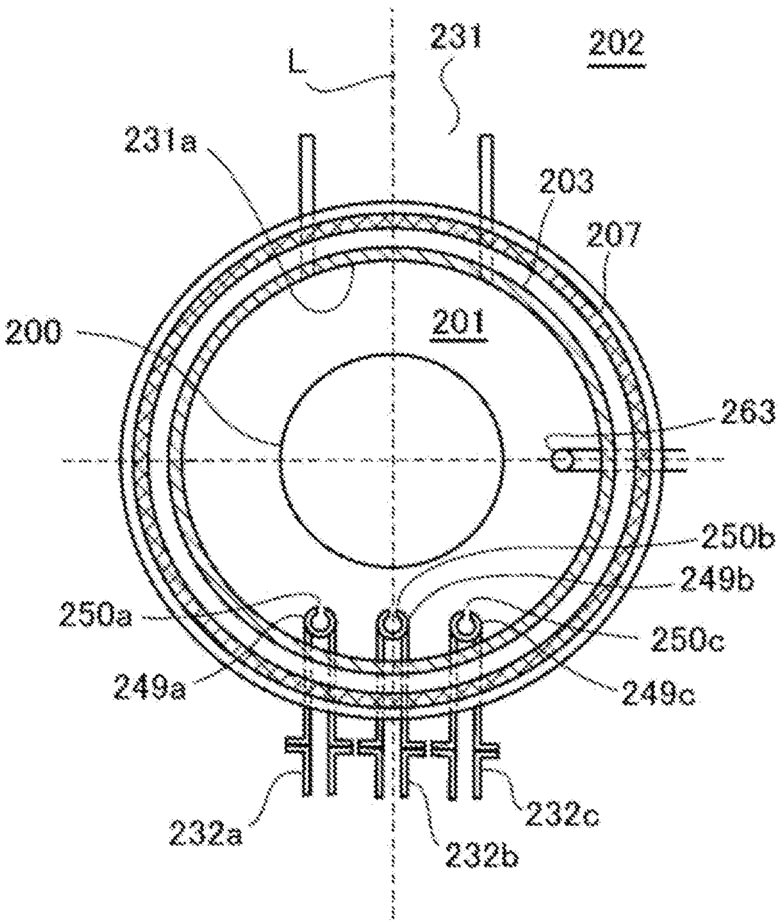
FIG. 2 is a schematic configuration view of a vertical process furnace of a substrate processing apparatus suitably used in embodiments of the present disclosure, in which a portion of a process furnace is shown in a cross section taken along line A-A in FIG. 1.

As shown in FIG. 2, each of the nozzles 249*a* to 249*c* is installed in an annular space (in a plane view) between an inner wall of the reaction tube 203 and the wafers 200 so as to extend upward from a lower side to an upper side of the inner wall of the reaction tube 203, that is, along an arrangement direction of the wafers 200. Specifically, each of the nozzles 249*a* to 249*c* is installed in a region horizontally surrounding a wafer arrangement region in which the wafers 200 are arranged at a lateral side of the wafer arrangement region, along the wafer arrangement region. In the plane view, the nozzle 249*b* is disposed so as to face an exhaust port 231*a* to be described later in a straight line with the centers of the wafers 200 loaded into the process chamber 201, which are interposed therebetween. The nozzles 249*a* and 249*c* are arranged so as to sandwich a straight line L passing through the nozzle 249*b* and the center of the exhaust port 231*a* from both sides along the inner wall of the reaction tube 203 (outer peripheral sides of the wafer 200). The straight line L is also a straight line passing through the nozzle 249*b* and the centers of the wafers 200. That is, it may be said that the nozzle 249*c* is installed on the side opposite the nozzle 249*a* with the straight line L interposed therebetween. The nozzles 249*a* and 249*c* are arranged in line symmetry with the straight line L as an axis of symmetry. Gas supply holes 250*a* to 250*c* configured to supply a gas are formed on the side surfaces of the nozzles 249*a* to 249*c*, respectively. Each of the gas supply holes 250*a* to 250*c* is opened so as to oppose (face) the exhaust port 231*a* in a plane view, which enables a gas to be supplied toward the wafers 200. A plurality of gas supply holes 250*a* to 250*c* are formed from the lower side to the upper side of the reaction tube 203.

A modifying agent is supplied from the gas supply pipe 232*a* into the process chamber 201 via the MFC 241*a*, the valve 243*a*, and the nozzle 249*a*.

A precursor is supplied from the gas supply pipe 232*b* into the process chamber 201 via the MFC 241*b*, the valve 243*b*, and the nozzle 249*b*. The precursor is used as a film-forming agent.

A reactant is supplied from the gas supply pipe 232*c* into the process chamber 201 via the MFC 241*c*, the valve 243*c*, and the nozzle 249*c*. The reactant is used as a film-forming agent.

A catalyst is supplied from the gas supply pipe 232*d* into the process chamber 201 via the MFC 241*d*, the valve 243*d*, the gas supply pipe 232*a*, and the nozzle 249*a*. The catalyst is used as a film-forming agent.

A cleaning agent is supplied from the gas supply pipe 232*e* into the process chamber 201 via the MFC 241*e*, the valve 243*e*, the gas supply pipe 232*b*, and the nozzle 249*b*.

An inert gas is supplied from the gas supply pipes 232*f* to 232*h* into the process chamber 201 via the MFCs 241*f* to 241*h*, the valves 243*f* to 243*h*, the gas supply pipes 232*a* to 232*c*, and the nozzles 249*a* to 249*c*, respectively. The inert gas acts as a purge gas, a carrier gas, a dilution gas, or the like.

A modifying agent supply system mainly includes the gas supply pipe 232*a*, the MFC 241*a*, and the valve 243*a*. A precursor supply system mainly includes the gas supply pipe 232*b*, the MFC 241*b*, and the valve 243*b*. A reactant supply system mainly includes the gas supply pipe 232*c*, the MFC 241*c*, and the valve 243*c*. A catalyst supply system mainly includes the gas supply pipe 232*d*, the MFC 241*d*, and the valve 243*d*. A cleaning agent supply system mainly includes the gas supply pipe 232*e*, the MFC 241*e*, and the valve 243*e*. An inert gas supply system mainly includes the gas supply pipes 232*f* to 232*h*, the MFCs 241*f* to 241*h*, and the valves 243*f* to 243*h*. Each or the entirety of the precursor supply system, the reactant supply system, and the catalyst supply system are also referred to as a film-forming agent supply system.

One or the entirety of the above-described various supply systems may be configured as an integrated-type supply system 248 in which the valves 243*a* to 243*h*, the MFCs 241*a* to 241*h*, and so on are integrated. The integrated-type supply system 248 is connected to each of the gas supply pipes 232*a* to 232*h*. In addition, the integrated-type supply system 248 is configured such that operations of supplying various materials (various gases) into the gas supply pipes 232*a* to 232*h* (that is, the opening/closing operation of the valves 243*a* to 243*h*, the flow rate regulating operation by the MFCs 241*a* to 241*h*, and the like) are controlled by a controller 121 which will be described later. The integrated-type supply system 248 is configured as an integral type or detachable-type integrated unit, and may be attached to and detached from the gas supply pipes 232*a* to 232*h* and the like on an integrated unit basis, such that maintenance, replacement, extension, etc. of the integrated-type supply system 248 may be performed on an integrated unit basis.

The exhaust port 231*a* configured to exhaust an internal atmosphere of the process chamber 201 is provided below the sidewall of the reaction tube 203. As shown in FIG. 2, in a plane view, the exhaust port 231*a* is provided at a position opposing (facing) the nozzles 249*a* to 249*c* (the gas supply holes 250*a* to 250*c*) with the wafers 200 interposed therebetween. The exhaust port 231*a* may be provided from a lower side to an upper side of the sidewall of the reaction tube 203, that is, along the wafer arrangement region. An exhaust pipe 231 is connected to the exhaust port 231*a*. A vacuum pump 246 as a vacuum exhauster is connected to the exhaust pipe 231 via a pressure sensor 245, which is a pressure detector (pressure detection part) configured to detect the internal pressure of the process chamber 201, and an auto pressure controller (APC) valve 244, which is a pressure regulator (pressure regulation part). The APC valve 244 is configured to be capable of performing or stopping a vacuum exhaust operation in the process chamber 201 by opening/closing the valve while the vacuum pump 246 is actuated, and is also configured to be capable of regulating the internal pressure of the process chamber 201 by adjusting an opening state of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening lid configured to be capable of hermetically sealing a lower end opening of the manifold 209, is provided under the manifold 209. The seal cap 219 is made of, for example, a metal material such as SUS, and is formed in a disc shape. An O-ring 220*b*, which is a seal making contact with the lower end of the manifold 209, is installed on an upper surface of the seal cap 219. A rotator 267 configured to rotate a boat 217, which will be described later, is installed under the seal cap 219. A rotary shaft 255 of the rotator 267 is connected to the boat 217 through the seal cap 219. The rotator 267 is configured to rotate the wafers 200 by rotating the boat 217. The seal cap 219 is configured to be vertically moved up or down by a boat elevator 115 which is an elevator installed outside the reaction tube 203. The boat elevator 115 is configured as a transfer apparatus (transfer equipment) which loads/unloads (transfers) the wafers 200 into/out of the process chamber 201 by moving the seal cap 219 up or down.

A shutter 219*s*, which serves as a furnace opening lid configured to be capable of hermetically sealing a lower end opening of the manifold 209 in a state where the seal cap 219 is lowered and the boat 217 is unloaded from the process chamber 201, is provided under the manifold 209. The shutter 219*s* is made of, for example, a metal material such as SUS, and is formed in a disc shape. An O-ring 220*c*, which is a seal making contact with the lower end of the manifold 209, is installed on an upper surface of the shutter 219*s*. The opening/closing operation (such as elevation operation, rotation operation, or the like) of the shutter 219*s* is controlled by a shutter opening/closing equipment 115*s*.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of, for example, a heat resistant material such as quartz or SiC. Heat insulating plates 218 made of, for example, a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that a temperature distribution in the process chamber 201 becomes a desired temperature distribution. The temperature sensor 263 is provided along the inner wall of the reaction tube 203.

Figure 3:
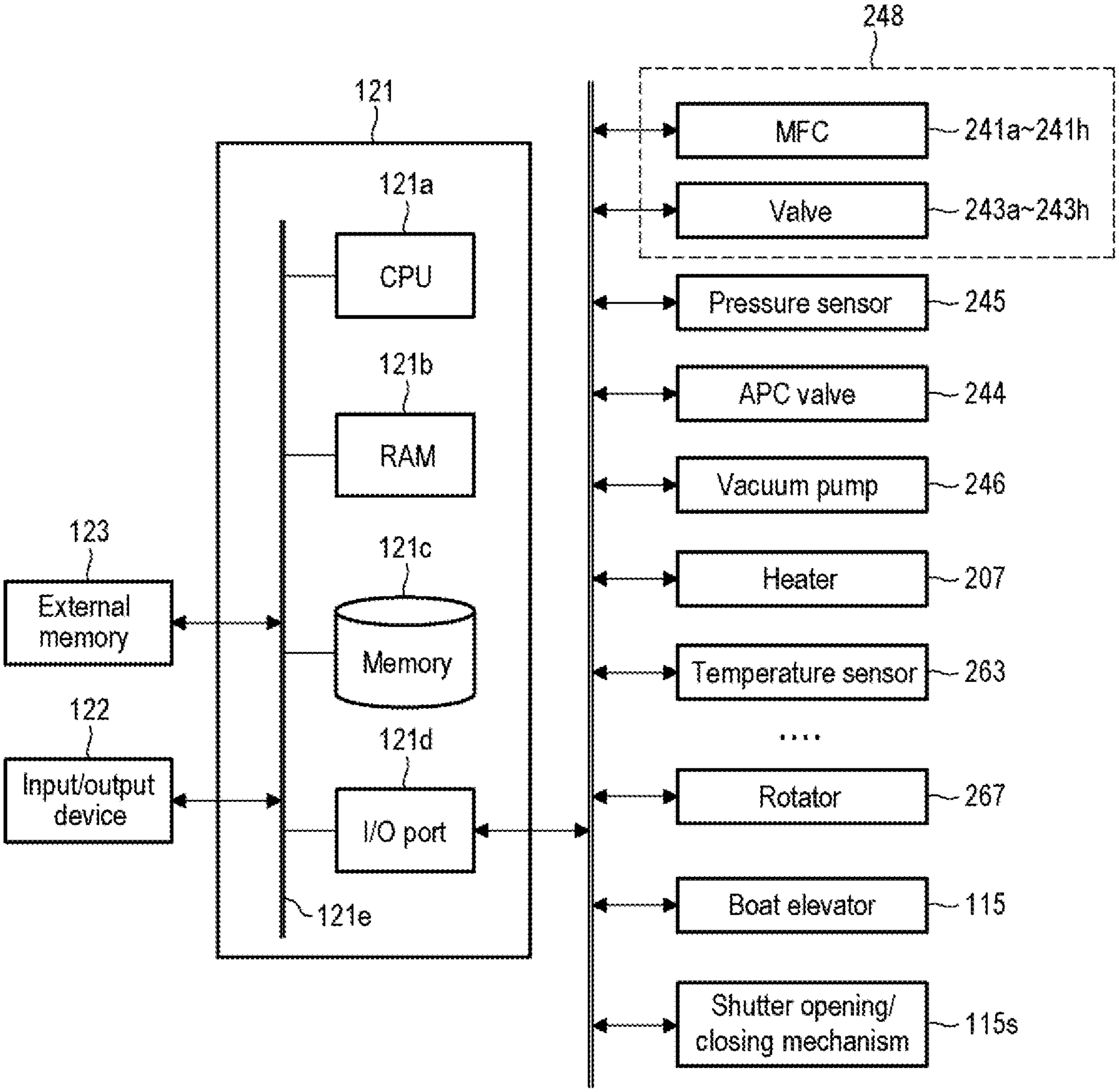
FIG. 3 is a schematic configuration diagram of a controller of a substrate processing apparatus suitably used in embodiments of the present disclosure, in which a control system of the controller is shown in a block diagram.

As shown in FIG. 3, a controller 121, which is a control part (control means or unit), is configured as a computer including a central processing unit (CPU) 121*a*, a random access memory (RAM) 121*b*, a memory 121*c*, and an I/O port 121*d*. The RAM 121*b*, the memory 121*c*, and the I/O port 121*d* are configured to be capable of exchanging data with the CPU 121*a* via an internal bus 121*e*. An input/output device 122 including, e.g., a touch panel or the like, is connected to the controller 121. Further, an external memory 123 may be connected to the controller 121.

The memory 121*c* includes, for example, a flash memory, a hard disk drive (HDD), a solid state drive (SSD), or the like. A control program that controls operations of a substrate processing apparatus, a process recipe in which sequences and conditions of substrate processing to be described later are written, etc. are readably stored in the memory 121*c*. The process recipe functions as a program and is combined to cause, by the controller 121, the substrate processing apparatus to execute each sequence in the substrate processing, which will be described later, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 121*b* is configured as a memory area (work area) in which programs or data read by the CPU 121*a* are temporarily stored.

The I/O port 121*d* is connected to the MFCs 241*a* to 241*h*, the valves 243*a* to 243*h*, the pressure sensor 245, the APC valve 244, the vacuum pump 246, the temperature sensor 263, the heater 207, the rotator 267, the boat elevator 115, the shutter opening/closing equipment 115*s*, and so on.

The CPU 121*a* is configured to be capable of reading and executing the control program from the memory 121*c*. The CPU 121*a* is also configured to be capable of reading the recipe from the memory 121*c* according to an input of an operation command from the input/output device 122. The CPU 121*a* is configured to be capable of controlling the flow rate regulating operation of various kinds of materials (gases) by the MFCs 241*a* to 241*h*, the opening/closing operation of the valves 243*a* to 243*h*, the opening/closing operation of the APC valve 244, the pressure regulating operation performed by the APC valve 244 based on the pressure sensor 245, the actuating and stopping operation of the vacuum pump 246, the temperature regulating operation performed by the heater 207 based on the temperature sensor 263, the operation of rotating the boat 217 with the rotator 267 and adjusting a rotation speed of the boat 217, the operation of moving the boat 217 up or down by the boat elevator 115, the opening/closing operation of the shutter 219*s* by the shutter opening/closing equipment 115*s*, and so on, according to contents of the read recipe.

The controller 121 may be configured by installing, on the computer, the aforementioned program recorded and stored in the external memory 123. Examples of the external memory 123 may include a magnetic disk such as a HDD, an optical disc such as a CD, a magneto-optical disc such as a MO, a semiconductor memory such as a USB memory or a SSD, and the like. The memory 121*c* or the external memory 123 is configured as a computer-readable recording medium. Hereinafter, the memory 121*c* and the external memory 123 may be generally and simply referred to as a "recording medium." When the term "recording medium" is used herein, it may indicate a case of including the memory 121*c*, a case of including the external memory 123, or a case of including both the memory 121*c* and the external memory 123. Furthermore, the program may be provided to the computer by using communicator such as the Internet or a dedicated line, instead of using the external memory 123.

(2) Substrate Processing Process

As a process of manufacturing a semiconductor device by using the above-described substrate processing apparatus, an example of a method of processing a substrate, that is, a processing sequence for selectively forming a film on a second surface among a first surface and the second surface of a wafer 200 as a substrate, will be described mainly with reference to FIGS. 4 and 5A to 5E. In the following description, operations of the respective components constituting the substrate processing apparatus are controlled by the controller 121.

The surface of the wafer 200 includes the first surface and the second surface. An example in which the first surface includes an oxygen-containing film (first base) and the second surface includes an oxygen-free film (second base) will be described below. Further, as a typical example, a case where the oxygen-containing film is a silicon oxide film ($SiO_2$ film, hereinafter also referred to as a SiO film) and the oxygen-free film is a silicon nitride film ($Si_3N_4$ film, hereinafter also referred to as a SiN film) will be described below. That is, a case where the first surface includes the surface of the SiO film as the first base and the second surface includes the surface of the SiN film as the second base will be described below.

A processing sequence in some embodiments of the present disclosure includes:

(a) a step of supplying a modifying agent to a wafer 200 including a first surface and a second surface to form an inhibitor layer on the first surface and at least a portion of the second surface (modifying step); and (b) a step of forming a film on the second surface (film-forming step) by performing a cycle a predetermined number of times, the cycle including (b1) a step of supplying a precursor to the wafer 200 (precursor supplying step) and (b2) a step of supplying a reactant to the wafer 200 (reactant supplying step), wherein in the film-forming step, a process condition per cycle up to an n-th cycle (n is an integer of 1 or 2 or more) is set to be different from a process condition per cycle on and after an (n+1)-th cycle. Each step is performed in a non-plasma atmosphere.

Figure 4:
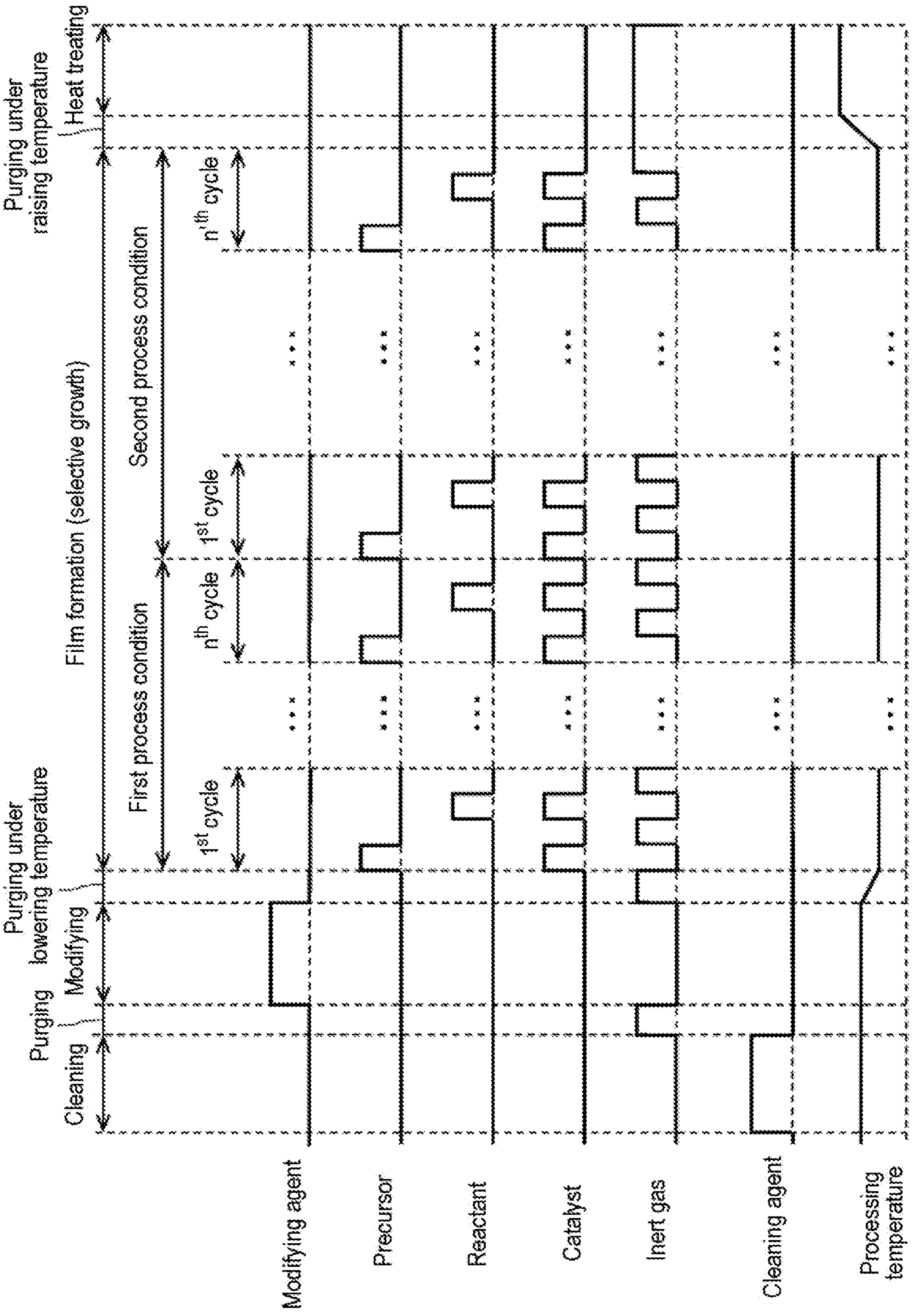
FIG. 4 is a diagram showing a processing sequence according to embodiments of the present disclosure.

In the following example, as shown in FIG. 4, in the film-forming step, a case will be described in which the above-described cycle including the precursor supplying step and the reactant supplying step is performed n times under a predetermined first process condition, and then this cycle is performed n' times (n' is an integer of 1 or 2 or more) under a second process condition different from the first process condition.

Further, in the following example, a case where a catalyst is supplied to the wafer 200 in at least one selected from the group of the precursor supplying step and the reactant supplying step will be described. As a representative example, an example in which the catalyst is supplied in both the precursor supplying step and the reactant supplying step is shown in FIG. 4.

In the present disclosure, for the sake of convenience, the above-described processing sequence may be denoted as follows. The same denotation may be used in modifications and other embodiments to be described later.

Modifying agent→(Precursor+Catalyst→Reactant+Catalyst)×n→(Precursor+Catalyst→Reactant+Catalyst)×n'

Further, as in the processing sequence shown below, depending on process conditions, the catalyst may not be supplied, or the catalyst may be supplied to the wafer 200 in at least one selected from the group of the precursor supplying step and the reactant supplying step.

Modifying agent→(Precursor→Reactant)×n→(Precursor→Reactant)×n'

Modifying agent→(Precursor+Catalyst→Reactant)×n→(Precursor+Catalyst→Reactant)×n'

Modifying agent→(Precursor→Reactant+Catalyst)×n→(Precursor→Reactant+Catalyst)×n'

Modifying agent→(Precursor+Catalyst→Reactant+Catalyst)×n→(Precursor+Catalyst→Reactant+Catalyst)×n'

Further, as in FIG. 4 and processing sequences shown below, before performing the modifying step, a step of removing a native oxide film formed on the surface of the wafer 200 (cleaning step) by supplying a cleaning agent to the wafer 200 may be further performed. Moreover, after performing the step of forming the film, a step of heat-treating the wafer 200 (heat-treating step) may be further performed.

Cleaning agent→Modifying agent→(Precursor→Reactant)×n→(Precursor→Reactant)×n'→Heat treatment Cleaning agent→Modifying agent→(Precursor+Catalyst→Reactant)×n→(Precursor+Catalyst→Reactant)×n'→Heat treatment Cleaning agent→Modifying agent→(Precursor→Reactant+Catalyst)×n→(Precursor→Reactant+Catalyst)×n'→Heat treatment Cleaning agent→Modifying agent→(Precursor+Catalyst→Reactant+Catalyst)×n→(Precursor+Catalyst→Reactant+Catalyst)×n'→Heat treatment When the term "wafer" is used in the present disclosure, it may refer to "a wafer itself" or "a stacked body of a wafer and certain layers or films formed on a surface of the wafer." When the phrase "a surface of a wafer" is used in the present disclosure, it may refer to "a surface of a wafer itself" or "a surface of a certain layer formed on a wafer." When an expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

The term "agent" used in the present disclosure includes at least one selected from the group of a gaseous substance and a liquefied substance. The liquefied substance includes a misty substance. That is, each of the modifying agent and the film-forming agent (precursor, reactant, or catalyst) may include a gaseous substance, a liquefied substance such as a misty substance, or both of them.

The term "layer" used in the present disclosure includes at least one selected from the group of a continuous layer and a discontinuous layer. For example, an inhibitor layer may include a continuous layer, a discontinuous layer, or both of them as long as it is possible to cause a film-forming inhibitory action.

(Wafer Charging and Boat Loading)

After the boat 217 is charged with a plurality of wafers 200 (wafer charging), the shutter 219s is moved by the shutter opening/closing equipment 115s and the lower end opening of the manifold 209 is opened (shutter opening). Thereafter, as shown in FIG. 1, the boat 217 charged with the plurality of wafers 200 is lifted up by the boat elevator 115 to be loaded into the process chamber 201 (boat loading). In this state, the seal cap 219 seals the lower end of the manifold 209 via the O-ring 220b. Thus, the wafers 200 are provided inside the process chamber 201.

Figure 5A:
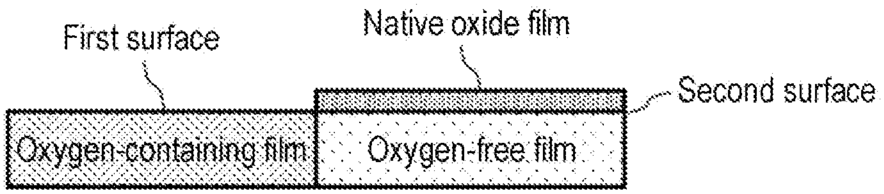
FIG. 5A is a schematic cross-sectional view showing a surface of a wafer including a first surface (surface of an oxygen-containing film) and a second surface (surface of an oxygen-free film), with a native oxide film formed on the second surface.

As shown in FIG. 5A, the surface of the wafer 200 charged in the boat 217 includes a first surface and a second surface. As described above, for example, a case where the first surface is the surface of a SiO film as an oxygen-containing film and the second surface is the surface of a SiN film as an oxygen-free film will be described herein. Further, as shown in FIG. 5A, a case where a native oxide film is formed on the second surface will be described herein.

(Pressure Regulation and Temperature Regulation)

After the boat loading is completed, the interior of the process chamber 201, that is, a space where the wafers 200 are placed, is vacuum-exhausted (decompression-exhausted) by the vacuum pump 246 to reach a desired pressure (state of vacuum). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 to reach a desired processing temperature. At this time, the state of supplying electric power to the heater 207 is feedback-controlled based on the temperature information detected by the temperature sensor 263 such that the interior of the process chamber 201 reaches a desired temperature distribution. Further, the rotation of the wafers 200 by the rotator 267 is started. The exhaust of the interior of the process chamber 201 and the heating and rotation of the wafers 200 are continuously performed at least until the processing on the wafers 200 is completed.

(Cleaning Step)

After that, a cleaning agent is supplied to the wafer 200.

Specifically, the valve 243e is opened to allow the cleaning agent to flow through the gas supply pipe 232e. A flow rate of the cleaning agent is regulated by the MFC 241e, and the cleaning agent is supplied into the process chamber 201 via the gas supply pipe 232b and the nozzle 249b and is exhausted via the exhaust port 231a. In this operation, the cleaning agent is supplied to the wafer 200 from the side of the wafer 200 (cleaning agent supply). At this time, the valves 243f to 243h may be opened to allow an inert gas to be supplied into the process chamber 201 via the nozzles 249a to 249c, respectively.

Figure 5B:
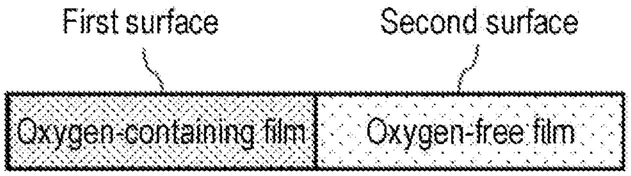
FIG. 5B is a schematic cross-sectional view showing a surface of the wafer after the native oxide film is removed from the second surface by performing a cleaning step from the state of FIG. 5A.

By supplying the cleaning agent to the wafer 200 under process conditions to be described later, the native oxide film formed on the second surface of the wafer 200 may be removed (etched) to expose the second surface, as shown in FIG. 5B. At this time, as shown in FIG. 5B, the first and second surfaces of the wafer 200 are exposed. When the first surface includes a SiO film and the second surface includes a SiN film, in a state where the first and second surfaces are exposed, the first surface is OH-terminated over its entire region and many regions of the second surface are not OH-terminated. That is, the first surface is terminated with OH groups over its entire region and many regions of the second surface are not terminated with OH groups.

A process condition when supplying the cleaning agent in the cleaning step is exemplified as follows:

Processing temperature: 50 to 200 degrees C., specifically 70 to 150 degrees C., Processing pressure: 10 to 2,000 Pa, specifically 100 to 1,500 Pa, Processing time: 10 to 60 minutes, specifically 30 to 60 minutes, Supply flow rate of cleaning gas: 0.05 to 1 slm, specifically 0.1 to 0.5 slm, and Supply flow rate of inert gas (for each gas supply pipe): 1 to 10 slm, specifically 2 to 10 slm.

In the present disclosure, a notation of a numerical range such as “50 to 200 degrees C.” means that the lower limit value and the upper limit value are included in the range. Therefore, for example, “50 to 200 degrees C.” means “50 degrees C. or higher and 200 degrees C. or lower.” The same applies to other numerical ranges. In the present disclosure, the processing temperature means the temperature of the wafer 200 or the internal temperature of the process chamber 201, and the processing pressure means the internal pressure of the process chamber 201. Further, the processing time means the time during which the processing is continued. Further, when 0 slm is included in the supply flow rate, 0 slm means a case where no substance (gas) is supplied. These apply equally to the following description.

After removing the native oxide film from the second surface to expose the second surface, the valve 243_e_ is closed to stop the supply of the cleaning agent into the process chamber 201. Then, the interior of the process chamber 201 is vacuum-exhausted to remove a gaseous substance and the like remaining in the process chamber 201 from the interior of the process chamber 201. At this time, the valves 243_f_ to 243_h_ are opened to allow an inert gas to be supplied into the process chamber 201 via the nozzles 249_a_ to 249_c_. The inert gas supplied from the nozzles 249_a_ to 249_c_ acts as a purge gas, whereby the interior of the process chamber 201 is purged (purging).

A process condition when performing a purging in the cleaning step is exemplified as follows:

Processing pressure: 1 to 30 Pa,

Processing time: 1 to 120 seconds, specifically 1 to 60 seconds, and

Supply flow rate of inert gas (for each gas supply pipe): 0.5 to 20 slm.

The processing temperature when performing a purging in this step may be the same as the processing temperature when supplying the cleaning agent.

As the cleaning agent, for example, a fluorine (F)-containing gas may be used. As the F-containing gas, for example, a chlorine trifluoride ($ClF_3$) gas, a chlorine fluoride (ClF) gas, a nitrogen fluoride ($NF_3$) gas, a hydrogen fluoride (HF) gas, a fluorine ($F_2$) gas, or the like may be used. As the cleaning agent, for example, an acetic acid ($CH_3COOH$) gas, a formic acid (HCOOH) gas, a hexafluoroacetylacetone ($C_5H_2F_6O_2$) gas, a hydrogen ($H_2$) gas, or the like may be used. Various cleaning liquids may also be used as the cleaning agent. For example, an acetic acid aqueous solution, a formic acid aqueous solution, or the like may be used as the cleaning agent. Alternatively, for example, DHF cleaning may be performed by using a HF aqueous solution as the cleaning agent. Further, for example, SC-1 cleaning (APM cleaning) may be performed by using a cleaning liquid containing ammonia water, hydrogen peroxide water, and pure water as the cleaning agent. Alternatively, for example, SC-2 cleaning (HPM cleaning) may be performed by using a cleaning liquid containing hydrochloric acid, hydrogen peroxide water, and pure water as the cleaning agent. Alternatively, for example, SPM cleaning may be performed by using a cleaning liquid containing sulfuric acid and hydrogen peroxide water as the cleaning agent. That is, the cleaning agent may be a gaseous substance or a liquefied substance. Further, the cleaning agent may be a liquefied substance such as a misty substance. One or more selected from the group of these may be used as the cleaning agent.

As the inert gas, a nitrogen ($N_2$) gas or a rare gas such as an argon (Ar) gas, a helium (He) gas, a neon (Ne) gas, or a xenon (Xe) gas may be used. One or more selected from the group of these gases may be used as the inert gas. This point also applies to each step to be described later.

When using the wafer 200 in which the native oxide film formed on the surface of the wafer 200 is removed in advance and the state of the wafer 200 is maintained, the cleaning step may be omitted. In that case, a modifying step, which will be described later, is performed after regulating the pressure and temperature.

(Modifying Step)

After performing the cleaning step, a modifying agent is applied to the wafer 200.

Specifically, the valve 243_a_ is opened to allow the modifying agent to flow through the gas supply pipe 232_a_. A flow rate of the modifying agent is regulated by the MFC 241_a_, and the modifying agent is supplied into the process chamber 201 via the nozzle 249_a_ and is exhausted via the exhaust port 231_a_. In this operation, the modifying agent is supplied to the wafer 200 from the side of the wafer 200 (modifying agent supply). At this time, the valves 243_f_ to 243_h_ may be opened to allow an inert gas to be supplied into the process chamber 201 via the nozzles 249_a_ to 249_c_, respectively.

Figure 5C:
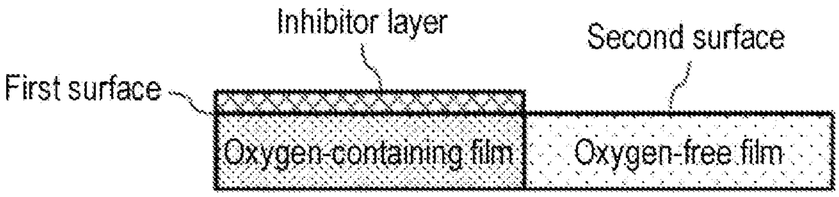
FIG. 5C is a schematic cross-sectional view showing a surface of the wafer after an inhibitor layer is formed on the first surface by performing a modifying step from the state of FIG. 5B.

By supplying the modifying agent to the wafer 200 under a process condition to be described later, as shown in FIG. 5C, inhibitor molecules, which are at least a portion of a molecular structure of molecules that constitute the modifying agent, may be chemisorbed on the first surface of the wafer 200 to modify the first surface to form an inhibitor layer on the first surface. That is, in this step, by supplying the modifying agent that reacts with the first surface to the wafer 200, the inhibitor molecules contained in the modifying agent are adsorbed on the first surface to modify the first surface to form the inhibitor layer on the first surface. This allows the first surface to be terminated with the inhibitor molecules. The inhibitor molecules are also called film-forming inhibition molecules (adsorption inhibition molecules or reaction inhibition molecules). Further, the inhibitor layer is also referred to as a film-forming inhibition layer (adsorption inhibition layer or reaction inhibition layer).

The inhibitor layer formed in this step contains the inhibitor molecules that are residues derived from the modifying agent. The inhibitor layer prevents a precursor (film-forming agent) from being adsorbed on the first surface to inhibit (suppress) progress of a film-forming reaction on the first surface in a film-forming step to be described later.

An example of the inhibitor molecules may include a trialkylsilyl group such as a trimethylsilyl group (—$SiMe_3$) or a triethylsilyl group (—$SiEt_3$). The trialkylsilyl group include an alkyl group, that is, a hydrocarbon group. In these cases, Si of the trimethylsilyl group or the triethylsilyl group is adsorbed on an adsorption site on the first surface of the wafer 200. When the first surface is the surface of a SiO film, the first surface contains an OH termination (OH group) as the adsorption site, and Si of the trimethylsilyl group or the triethylsilyl group is bonded to O of the OH termination (OH group) on the first surface, such that the first surface is terminated with an alkyl group such as a methyl group or an ethyl group, that is, with a hydrocarbon group. The alkyl group (alkylsilyl group) such as the methyl group (trimethylsilyl group) or the ethyl group (triethylsilyl group), that is, the hydrocarbon group, which terminates the first surface, constitutes the inhibitor layer and may prevent the precursor (film-forming agent) from being adsorbed on the first surface to inhibit (suppress) the progress of the film-forming reaction on the first surface in the film-forming step to be described later.

In this step, the inhibitor molecules may be adsorbed on at least a portion of the second surface of the wafer 200, but an amount of adsorption thereof is very small, and an amount of adsorption on the first surface of the wafer 200 is overwhelmingly large. Such selective (preferential) adsorption is possible because the process condition in this step is a condition that the modifying agent does not undergo gas phase decomposition in the process chamber 201. This is also possible because the first surface is OH-terminated over its entire region, whereas many regions of the second surface are not OH-terminated. In this step, since the modifying agent does not undergo the gas phase decomposition in the process chamber 201, the inhibitor molecules are not multiple-deposited on the first surface and the second surface, and the inhibitor molecules are selectively adsorbed on the first surface among the first surface and the second surface, whereby the first surface is selectively terminated by the inhibitor molecules.

A process condition when supplying the modifying agent in the modifying step is exemplified as follows:

Processing temperature: room temperature (25 degrees C.) to 500 degrees C., specifically room temperature to 250 degrees C., Processing pressure: 5 to 2,000 Pa, specifically 10 to 1,000 Pa, Processing time: 1 second to 120 minutes, specifically 30 seconds to 60 minutes, Supply flow rate of modifying agent: 0.001 to 3 slm, specifically 0.001 to 0.5 slm, and Supply flow rate of inert gas (for each gas supply pipe): 0 to 20 slm.

After selectively forming the inhibitor layer on the first surface of the wafer 200, the valve 243*a* is closed to stop the supply of the modifying agent into the process chamber 201. Then, a gaseous substance and the like remaining in the interior of the process chamber 201 are removed from the interior of the process chamber 201 (purging) according to the same processing procedure and process condition as the purging in the cleaning step. Further, the processing temperature when performing a purging in this step may be the same as the processing temperature when supplying the modifying agent.

As the modifying agent, for example, a compound with a structure in which an amino group is directly bonded to silicon (Si) or a compound with a structure in which an amino group and an alkyl group are directly bonded to silicon (Si) may be used.

Examples of the modifying agent may include (dimethylamino)silane ($(CH_3)_2NSiH_3$), (diethylamino)silane ($(C_2H_5)_2NSiH_3$), (dipropylamino)silane ($(C_3H_7)_2NSiH_3$), (dibutylamino)silane ($(C_4H_9)_2NSiH_3$), (dimethylamino)trimethylsilane ($(CH_3)_2NSi(CH_3)_3$), (diethylamino)triethylsilane ($(C_2H_5)_2NSi(C_2H_5)_3$), (dimethylamino)triethylsilane ($(CH_3)_2NSi(C_2H_5)_3$), (diethylamino)trimethylsilane ($(C_2H_5)_2NSi(CH_3)_3$), (dipropylamino)trimethylsilane ($(C_3H_7)_2NSi(CH_3)_3$), (dibutylamino)trimethylsilane ($(C_4H_9)_2NSi(CH_3)_3$), (trimethylsilyl)amine ($(CH_3)_3SiNH_2$), (triethylsilyl)amine ($(C_2H_5)_3SiNH_2$), and the like. One or more selected from the group of these may be used as the modifying agent.

Further, examples of the modifying agent may include bis(dimethylamino)dimethylsilane ($[(CH_3)_2N]_2Si(CH_3)_2$), bis(diethylamino)diethylsilane ($[(C_2H_5)_2N]_2Si(C_2H_5)_2$), bis(dimethylamino)diethylsilane ($[(CH_3)_2N]_2Si(C_2H_5)_2$), bis(diethylamino)dimethylsilane ($[(C_2H_5)_2N]_2Si(CH_3)_2$), bis(dimethylamino)silane ($[(CH_3)_2N]_2SiH_2$), bis(diethylamino)silane ($[(C_2H_5)_2N]_2SiH_2$), bis(dimethylaminodimethylsilyl)ethane ($[(CH_3)_2N(CH_3)_2Si]_2C_2H_6$), bis(dipropylamino)silane ($[(C_3H_7)_2N]_2SiH_2$), bis(dibutylamino)silane ($[(C_4H_9)_2N]_2SiH_2$), bis(dipropylamino)dimethylsilane ($[(C_3H_7)_2N]_2Si(CH_3)_2$), bis(dipropylamino)diethylsilane ($(C_3H_7)_2N]_2Si(C_2H_5)_2$), (dimethylsilyl)diamine ($(CH_3)_2Si(NH_2)_2$), (diethylsilyl)diamine ($(C_2H_5)_2Si(NH_2)_2$), (dipropylsilyl)diamine ($(C_3H_7)_2Si(NH_2)_2$), bis(dimethylaminodimethylsilyl)methane ($[(CH_3)_2N(CH_3)_2Si]_2CH_2$), bis(dimethylamino)tetramethyldisilane ($[(CH_3)_2N]_2(CH_3)_4Si_2$), and the like. One or more selected from the group of these may be used as the modifying agent.

(Film-Forming Step)

After performing the modifying step, a film-forming agent is supplied to the wafer 200 to form a film on the second surface of the wafer 200. That is, the film-forming agent that reacts with the second surface is supplied to the wafer 200 to selectively (preferentially) form a film on the second surface. Specifically, the following precursor supplying step and reactant supplying step are sequentially performed. In the following example, as described above, the film-forming agent includes a precursor, a reactant, and a catalyst. In the precursor supplying step and the reactant supplying step, the output of the heater 207 is regulated such that the temperature of the wafer 200 is kept equal to or less than the temperature of the wafer 200 in the cleaning step and the modifying step, specifically, as shown in FIG. 4, lower than the temperature of the wafer 200 in the cleaning step and the modifying step.

[Precursor Supplying Step]

In this step, as a film-forming agent, a precursor (precursor gas) and a catalyst (catalyst gas) are supplied to the wafer 200 subjected to the modifying step, that is, the wafer 200 with the inhibitor layer selectively formed on the first surface.

Specifically, the valves 243*b* and 243*d* are opened to allow the precursor and the catalyst to flow through the gas supply pipes 232*b* and 232*d*, respectively. Flow rates of the precursor and the catalyst are regulated by the MFCs 241*b* and 241*d*, respectively, and the precursor and the catalyst are supplied into the process chamber 201 via the nozzles 249*b* and 249*a*, respectively, are mixed in the process chamber 201, and are exhausted via the exhaust port 231*a*. In this operation, the precursor and the catalyst are supplied to the wafer 200 from the side of the wafer 200 (precursor+catalyst supply). At this time, the valves 243*f* to 243*h* may be opened to allow an inert gas to be supplied into the process chamber 201 via the nozzles 249*a* to 249*c*, respectively.

By supplying the precursor and the catalyst to the wafer 200 under the process condition to be described later, it is possible to selectively chemisorb at least a portion of a molecular structure of molecules constituting the precursor on the second surface while suppressing at least a portion of the molecular structure of the molecules constituting the precursor from being chemisorbed on the first surface. As a result, a first layer is selectively formed on the second surface. The first layer contains at least a portion of the molecular structure of the molecules constituting the precursor, which are residues of the precursor. That is, the first layer contains at least a portion of atoms constituting the precursor.

In this step, by supplying the catalyst together with the precursor, the above-mentioned reaction may proceed in a non-plasma atmosphere and under a low-temperature condition as will be described later. In this way, by forming the first layer in the non-plasma atmosphere and under the low-temperature condition as will be described later, it is possible to maintain molecules and atoms constituting the inhibitor layer formed on the first surface without extinguishing (desorbing) the molecules and atoms from the first surface.

Further, by forming the first layer in the non-plasma atmosphere and under the low-temperature condition as will be described later, the precursor may be prevented from being thermally decomposed (gas phase-decomposed), that is, autolyzed, in the process chamber 201. As a result, it is possible to prevent multiple deposition of at least a portion of the molecular structure of molecules constituting the precursor on the first surface and the second surface and cause at least a portion of the molecular structure of molecules constituting the precursor to be selectively adsorbed on the second surface.

Further, in this step, at least a portion of the molecular structure of the molecules constituting the precursor may be adsorbed on a portion of the first surface of the wafer 200, but an amount of adsorption thereof is very small, and an amount of adsorption on the second surface of the wafer 200 is overwhelmingly large. Such selective (preferential) adsorption is possible because the process condition in this step is set to a low-temperature condition as will be described later and a condition that the precursor does not undergo gas phase decomposition in the process chamber 201. This is also possible because the inhibitor layer is formed over the entire region of the first surface, whereas the inhibitor layer is not formed over many regions of the second surface.

After selectively forming the first layer on the second surface of the wafer 200, the valves **243*b* and 243*d* are closed to stop the supply of the precursor and the catalyst into the process chamber 201, respectively. Then, a gaseous substance and the like remaining in the process chamber 201 are removed from the interior of the process chamber 201** (purging) according to the same processing procedure and process condition as the purging in the cleaning step. Further, the processing temperature when performing the purging in this step may be the same as the processing temperature when supplying the precursor and the catalyst.

As the precursor, for example, a Si— and halogen-containing gas (Si— and halogen-containing substance) may be used. The halogen includes chlorine (Cl), fluorine (F), bromine (Br), iodine (I), and the like. The Si— and halogen-containing gas may contain halogen in the form of a chemical bond between Si and halogen. As the Si— and halogen-containing gas, for example, a silane-based gas containing a Si—Cl bond, that is, a chlorosilane-based gas, may be used. The Si— and halogen-containing gas may further contain C, and in such a case, the Si— and halogen-containing gas may contain C in the form of a Si—C bond. As the Si— and halogen-containing gas, for example, a silane-based gas containing Si, Cl, and an alkylene group and containing a Si—C bond, that is, an alkylenechlorosilane-based gas, may be used. The alkylene group includes a methylene group, an ethylene group, a propylene group, a butylene group, and the like. Further, as the Si— and halogen-containing gas, for example, a silane-based gas containing Si, Cl, and an alkyl group and containing a Si—C bond, that is, an alkylchlorosilane-based gas may be used. The alkyl group includes a methyl group, an ethyl group, a propyl group, a butyl group, and the like. The Si— and halogen-containing gas may further contain O, and in such a case, the Si— and halogen-containing gas may contain O in the form of a Si—O bond, for example, in the form of a siloxane bond (Si—O—Si bond). As the Si— and halogen-containing gas, for example, a silane-based gas containing Si, Cl, and a siloxane bond, that is, a chlorosiloxane-based gas, may be used. These gases may contain Cl in the form of a Si—Cl bond. As the precursor, in addition to these, an amino group-containing gas (amino group-containing substance) such as an aminosilane-based gas may also be used.

Examples of the precursor may include tetrachlorosilane ($SiCl_4$), hexachlorodisilane ($Si_2Cl_6$), octachlorotrisilane ($Si_3Cl_8$), and the like. Further, examples of the precursor may include hexachlorodisiloxane ($Cl_3Si—O—SiCl_3$), octachlorotrisiloxane ($Cl_3Si—O—SiCl_2—O—SiCl_3$), and the like. Further, examples of the precursor may include 1,1,3,3-tetrachloro-1,3-disilacyclobutane ($C_2H_4Cl_4Si_2$), bis(trichlorosilyl)methane ($(SiCl_3)_2CH_2$), 1,2-bis(trichloro silyl)ethane ($(SiCl_3)_2C_2H_4$), 1,1,2,2-tetrachloro-1,2-dimethyldisilane ($(CH_3)_2Si_2Cl_4$), 1,2-dichloro-1,1,2,2-tetramethyldisilane ($(CH_3)_4Si_2Cl_2$), and the like. One or more from the group of these may be used as the precursor.

Further, examples of the precursor may include tetrakis (dimethylamino)silane ($Si[N(CH_3)_2]_4$), tris(dimethylamino) silane ($Si[N(CH_3)_2]_3H$), bis(diethylamino)silane ($Si[N(C_2H_5)_2]_2H_2$), bis(tert-butylamino)silane ($SiH_2[NH(C_4H_9)]_2$), (diisopropylamino)silane ($SiH_3[N(C_3H_7)_2]$), and the like. One or more selected from the group of these may be used as the precursor.

As the catalyst, for example, an amine-based gas (amine-based substance) containing carbon (C), nitrogen (N), and hydrogen (H) may be used. As the amine-based gas (amine-based substance), a chain amine-based gas (chain amine-based substance) or a cyclic amine-based gas (cyclic amine-based substance) may be used. Examples of the catalyst may include chain amines such as triethylamine ($(C_2H_5)_3N$), diethylamine ($(C_2H_5)_2NH$), monoethylamine ($(C_2H_5)NH_2$), trimethylamine ($(CH_3)_3N$), dimethylamine ($(CH_3)_2NH$), and monomethylamine ($(CH_3)NH_2$). Further, examples of the catalyst may include cyclic amines such as aminopyridine ($C_5H_6N_2$), pyridine ($C_5H_5N$), picoline ($C_6H_7N$), lutidine ($C_7H_9N$), pyrimidine ($C_4H_4N_2$), quinoline ($C_9H_7N$), piperazine ($C_4H_{10}N_2$), piperidine ($C_5H_{11}N$), and aniline ($C_6H_7N$). One or more selected from the group of these may be used as the catalyst. This point also applies to the reactant supplying step which will be described later.

[Reactant Supplying Step]

After the precursor supplying step is completed, as a film-forming agent, a reactant (reaction gas) and a catalyst (catalyst gas) are supplied to the wafer 200, that is, the wafer 200 with the first layer selectively formed on the second surface. Herein, an example of using an oxidizing agent (oxidizing gas) as the reactant (reacting gas) will be described.

Specifically, the valves **243*c* and 243*d* are opened to allow the reactant and the catalyst to flow through the gas supply pipes 232*c* and 232*d*, respectively. Flow rates of the reactant and the catalyst are regulated by the MFCs 241*c* and 241*d*, respectively, and the reactant and the catalyst are supplied into the process chamber 201 via the nozzles 249*c* and 249*a*, respectively, are mixed in the process chamber 201, and are exhausted via the exhaust port 231*a*. In this operation, the reactant and the catalyst are supplied to the wafer 200 from the side of the wafer 200 (reactant+catalyst supply). At this time, the valves 243*f* to 243*h* may be opened to allow an inert gas to be supplied into the process chamber 201 via the nozzles 249*a* to 249*c***, respectively.

By supplying the reactant and the catalyst to the wafer 200 under the process condition to be described below, it is possible to oxidize at least a portion of the first layer formed on the second surface of the wafer 200 in the precursor supplying step. As a result, a second layer formed by oxidizing the first layer is formed on the second surface.

In this step, by supplying the catalyst together with the reactant, the above-mentioned reaction may proceed in a non-plasma atmosphere and under a low-temperature condition as will be described later. In this way, by forming the second layer in the non-plasma atmosphere and under the low-temperature condition as will be described later, it is possible to maintain the molecules and atoms constituting the inhibitor layer formed on the first surface without extinguishing (desorbing) the molecules and atoms from the first surface.

After the first layer formed on the second surface is oxidized to be changed (converted) into the second layer, the valves 243*c* and 243*d* are closed to stop the supply of the reactant and the catalyst into the process chamber 201, respectively. Then, a gaseous substance and the like remaining in the interior of the process chamber 201 are removed from the interior of the process chamber 201 (purging) according to the same processing procedure and process condition as the purging in the cleaning step. Further, the processing temperature when performing the purging in this step be the same as the processing temperature when supplying the reactant and the catalyst.

As the reactant, that is, the oxidizing agent, for example, an oxygen (O)- and hydrogen (H)-containing gas (O- and H-containing substance) may be used. Examples of the O- and H-containing gas may include water vapor ($H_2O$ gas), a hydrogen peroxide ($H_2O_2$) gas, hydrogen ($H_2$) gas+oxygen ($O_2$) gas, $H_2$ gas+ozone ($O_3$) gas, and the like. That is, O-containing gas+H-containing gas may also be used as the O- and H-containing gas. In this case, as the H-containing gas, that is, a reducing gas, a deuterium ($D_2$) gas may be used instead of the $H_2$ gas. One or more selected from the group of these gases may be used as the reactant.

In the present disclosure, the description of two gases such as "$H_2$ gas+$O_2$ gas" together means a mixed gas of $H_2$ gas and $O_2$ gas. When supplying the mixed gas, the two gases may be mixed (pre-mixed) in a supply pipe and then supplied into the process chamber 201, or the two gases may be supplied separately from different supply pipes into the process chamber 201 and then mixed (post-mixed) in the process chamber 201.

Further, as the reactant, that is, the oxidizing agent, an O-containing gas (O-containing substance) may be used in addition to the O- and H-containing gas. Examples of the O-containing gas may include an $O_2$ gas, an $O_3$ gas, a nitrous oxide ($N_2O$) gas, a nitric oxide (NO) gas, a nitrogen dioxide ($NO_2$) gas, a carbon monoxide (CO) gas, a carbon dioxide ($CO_2$) gas, and the like. In addition to these gases, as the reactant, that is, the oxidizing agent, the above-mentioned various aqueous solutions and various cleaning liquids may also be used. In this case, an oxidation target on the surface of the wafer 200 may be oxidized by exposing the wafer 200 to the aqueous solutions or the cleaning liquids. One or more selected from the group of these gases may be used as the reactant.

As the catalyst, for example, catalysts similar to the various catalysts exemplified in the above-described precursor supplying step may be used.

[Performing Predetermined Number of Times]

Figure 5D:
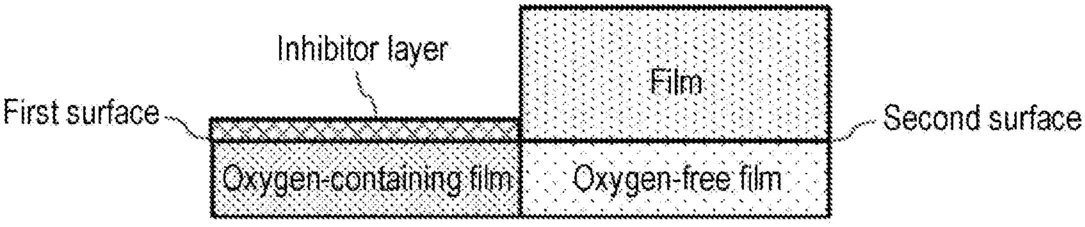
FIG. 5D is a schematic cross-sectional view showing a surface of the wafer after a film is selectively formed on the second surface by performing a film-forming step from the state of FIG. 5C.

By performing a cycle a predetermined number of times (n+n' times, where each of n and n' is an integer of 1 or 2 or more), the cycle including non-simultaneously, that is, without synchronization, alternately performing the above-described precursor supplying step and reactant supplying step under a predetermined process condition, a film may be selectively (preferentially) formed on the second surface of the wafer 200, as shown in FIG. 5D. For example, when the above-mentioned precursor, reactant, and catalyst are used, a silicon oxycarbide film (SiOC film) or a silicon oxide film (SiO film) may be selectively grown as the film on the second surface. The above-described cycle may be performed a plurality of times. That is, a thickness of the second layer formed per cycle may be set to be smaller than a desired film thickness, and the above-described cycle may be performed a plurality of times until a thickness of a film formed by stacking second layers reaches a desired film thickness.

As described above, the film may be selectively grown on the second surface of the wafer 200 by performing the above-described cycle a predetermined number of times. At this time, since the inhibitor layer is formed on the first surface of the wafer 200, the growth of the film on the first surface may be suppressed. That is, by performing the above-described cycle a predetermined number of times, it is possible to promote the growth of the film on the second surface while suppressing the growth of the film on the first surface.

Further, when performing the precursor supplying step and the reactant supplying step, since the inhibitor layer formed on the first surface is maintained on the first surface as described above, the growth of the film on the first surface may be suppressed. However, in some cases, such as when the formation of the inhibitor layer on the first surface is insufficient due to some factor, the growth of the film on the first surface may occur very slightly. However, even in this case, the thickness of the film formed on the first surface is much thinner than the thickness of the film formed on the second surface. In the present disclosure, when a phrase "high selectivity in selective growth" is used, it may include a case where a very thin film is formed on the first surface but a much thicker film is formed on the second surface, as well as a case where no film is formed on the first surface and a film is formed on the second surface.

By the way, as described above, when the modifying step is performed, inhibitor molecules may be adsorbed on at least a portion of the second surface of the wafer 200. An amount of this adsorption is extremely small and does not interfere with the film growth on the second surface of wafer 200. However, under certain circumstances, a characteristic of the film selectively formed on the second surface of wafer 200 may be degraded. For example, in a case where a recess such as a trench or a hole is formed on the surface of the wafer 200 and the first surface and the second surface are alternately arranged on the side surface (inner side surface or inner wall) of the recess, or in a case where the first surface and the second surface are alternately arranged parallel to a flat surface of the wafer 200, that is, in a case where the first surface and the second surface are alternately arranged in the plane of the wafer 200, step coverage, wafer in-plane film thickness uniformity, surface roughness, etc. of the film selectively formed on the second surface of the wafer 200 may be degraded. The surface roughness means a height difference of a surface of a film within the wafer plane or within an arbitrary target plane, and as a value of the surface roughness becomes smaller, the surface becomes smoother, and conversely, as the value becomes larger, the surface becomes rougher. In the present disclosure, "the surface roughness is improved (favorable)" means that the height difference on the surface of the film is reduced and the smoothness is improved (favorable), and conversely, "the surface roughness is degraded" means that the height difference of the surface of the film is increased and the smoothness is degraded. A film with good surface roughness means a film with good smoothness, that is, a film with high smoothness.

The reasons why the above-described matters may occur will be described below with reference to FIGS. 6A to 6D.

Figure 6A:
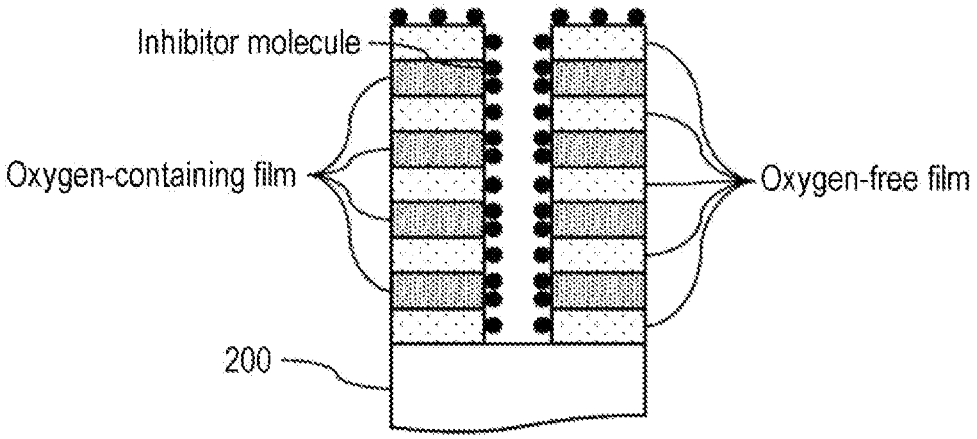
FIG. 6A is a schematic cross-sectional view showing a surface of a wafer after performing a modifying step on the wafer in which a recess is formed on the surface of the wafer and a first surface (surface of an oxygen-containing film) and a second surface (surface of an oxygen-free film) are alternately arranged on a side surface of the recess.

FIG. 6A is a schematic cross-sectional view showing a surface of the wafer 200 after performing the cleaning step and the modifying step in this order on the wafer 200 in which a recess is formed on the surface of the wafer 200 and the first surface (surface of the oxygen-containing film) and the second surface (surface of the oxygen-free film) are alternately arranged adjacent to each other on the side surface (inner side surface and inner wall) of the recess, under the above-described processing procedure and process condition. The symbol "●" in the figure indicates an inhibitor molecule. As shown in this figure, by performing the cleaning step and the modifying step in this order under the above-described processing procedure and process condition, the inhibitor molecules may be adsorbed on at least a portion of the second surface as well as the first surface of the wafer 200. That is, an inhibitor layer may be formed on at least a portion of the second surface as well as the first surface of the wafer 200. The inhibitor layer formed on the second surface of the wafer 200 may function as a film-forming inhibition layer in the film-forming step, similarly to the inhibitor layer formed on the first surface.

However, as described above, the amount of adsorption of inhibitor molecules on the second surface is very small as compared to the amount of adsorption of inhibitor molecules on the first surface. Therefore, a density of the inhibitor layer formed on the second surface of the wafer 200 is much lower than that of the inhibitor layer formed on the first surface. Further, the inhibitor molecules adsorbed on the second surface where many regions are not OH-terminated tend to be easily desorbed or deactivated as compared to the inhibitor molecules adsorbed on the first surface where the entire region is OH-terminated. For these reasons, the inhibitor layer formed on the second surface of the wafer 200 tends to be more easily removed and/or invalidated than the inhibitor layer formed on the first surface. The removal of the inhibitor layer means that the inhibitor molecules as the film-forming inhibition molecules are desorbed from the surface of a base (the first surface and the second surface of the wafer 200) and the inhibitor layer as the film-forming inhibition layer disappears from the surface of the base. Further, the invalidation of the inhibitor layer means that the function of the inhibitor molecules contained in the inhibitor layer as the film-forming inhibiting molecules is deactivated due to a change in a molecular structure, an atomic arrangement structure, etc., and the inhibitor layer formed on the surface of the base (the first surface or the second surface of the wafer 200) loses the function as the film-forming inhibition layer.

Figure 6B:
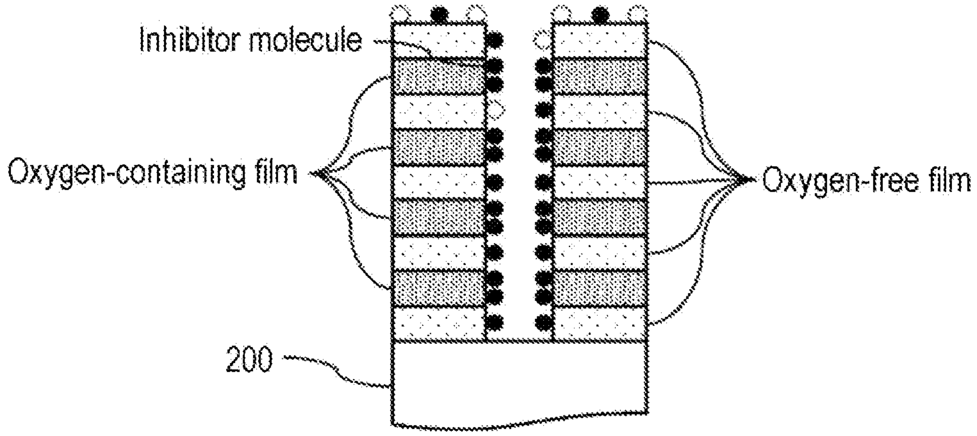
FIG. 6B is a schematic cross-sectional view showing a surface of the wafer after starting a film-forming step under a predetermined process condition from the state of FIG. 6A

FIG. 6B is a schematic cross-sectional view showing a surface of the wafer 200 after starting the film-forming step under the above-described processing procedure and predetermined process condition (process condition similar to the second process condition to be described later) from the state of FIG. 6A. As shown in this figure, by starting the film-forming step under the predetermined process condition from the state of FIG. 6A, the inhibitor molecules adsorbed on at least the portion of the second surface are desorbed from the second surface or are deactivated. That is, the inhibitor layer formed on at least the portion of the second surface is removed and/or invalidated.

However, an amount of desorption or an amount of deactivation of the inhibitor molecules (hereinafter, collectively referred to as the amount of desorption for the sake of convenience) may vary depending on the site. For example, the amount of desorption of the inhibitor molecules may be more in a top side, less in a middle side, and even less in a bottom side of the recess formed on the surface of the wafer 200. As a result, for example, as shown in FIG. 6B, a relatively large amount of inhibitor layer formed on the second surface located in the top side of the recess formed on the surface of the wafer 200 may be removed and/or invalidated, and the inhibitor layer formed on the second surface located in the middle side or bottom side of the recess may be maintained without being removed and/or invalidated. Further, for example, the amount of desorption of the inhibitor molecules may not be uniform over the plane of the second surface. As a result, the inhibitor layer formed in some regions of the second surface may be removed and/or invalidated, and the inhibitor layer formed in other regions may be maintained without being removed and/or invalidated. That is, the plane of the second surface may remain partially exposed, and may remain partially covered with the inhibitor layer.

Figure 6C:
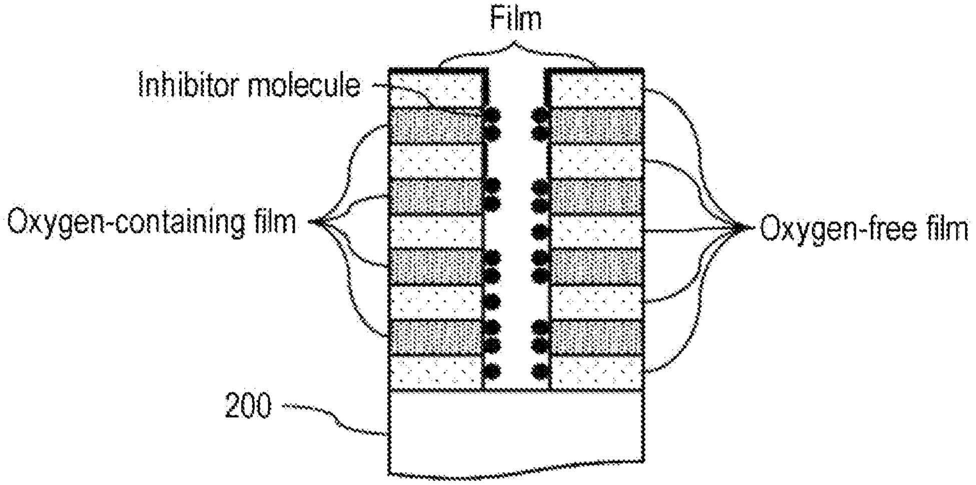
FIG. 6C is a schematic cross-sectional view showing a surface of the wafer after continuing the film-forming step without changing the process condition from the state of FIG. 6B.

FIG. 6C is a schematic cross-sectional view showing a surface of the wafer 200 after continuing the film-forming step without changing the above-described processing procedure and process condition from the state of FIG. 6B. As shown in this figure, by continuing the film-forming step without changing the processing procedure and process condition from the state of FIG. 6B, selective film growth (formation) is initiated in the second surface where the inhibitor layer was removed and/or invalidated.

In a case where the film-forming step is continued, at least a portion of the inhibitor molecules adsorbed on the second surface may be further desorbed or deactivated from the second surface. As a result, for example, at least a portion of the inhibitor layer formed on the second surface located in the middle side or the bottom side of the recess formed on the surface of the wafer 200 may be further removed and/or invalidated. Further, for example, at least a portion of the inhibitor layer maintained in a partial region within the plane of the second surface may be further removed and/or invalidated. Even on the second surface where the inhibitor layer is removed and/or invalidated at such a late timing, selective film growth is then initiated by continuing the film-forming step.

Even in a case where the film-forming step is continued, at least a portion of the inhibitor molecules adsorbed on the second surface may remain without being desorbed or deactivated. For example, as shown in FIG. 6C, a portion of the inhibitor layer formed on the second surface located in the middle side and the bottom side of the recess formed on the surface of the wafer 200 may be maintained without being removed and/or invalidated. Further, for example, a portion of the inhibitor layer maintained in a partial region within the plane of the second surface may be maintained without being removed and/or invalidated.

Figure 6D:
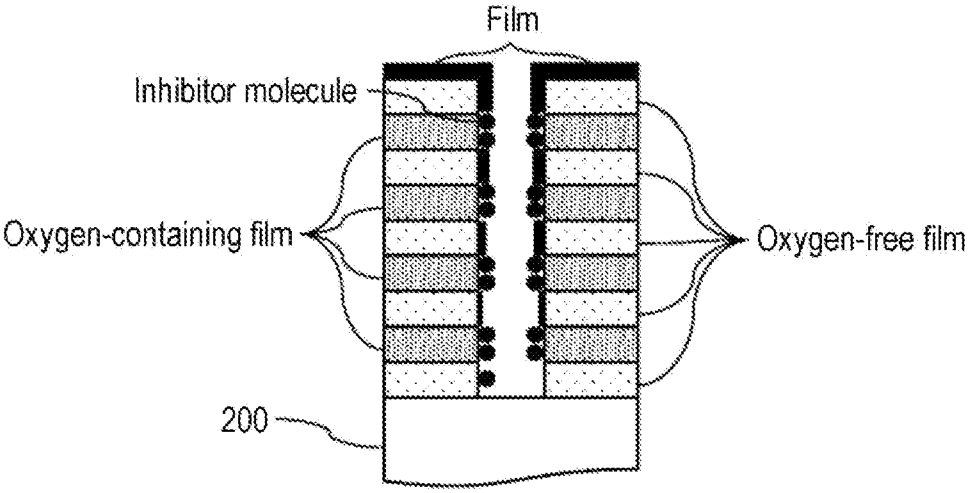
FIG. 6D is a schematic cross-sectional view showing a surface of the wafer after further continuing the film-forming step without changing the process condition from the state of FIG. 6C.

FIG. 6D is a schematic cross-sectional view showing a surface of the wafer 200 after further continuing the film-forming step without changing the above-described processing procedure and process condition from the state of FIG. 6C. As shown in this figure, by further continuing the film-forming step without changing the processing procedure and process condition from the state of FIG. 6C, a thick film is selectively formed on the second surface in the top side of the recess where the inhibitor layer was removed and/or invalidated at an early timing. Further, a thin film is selectively formed on the second surface in the middle side of the recess where the inhibitor layer was removed and/or invalidated at a later timing. Further, selective film growth remains uninitiated on the second surface in the bottom side of the recess where the inhibitor layer is maintained without being removed and/or invalidated.

In this way, when the modifying step is performed, the inhibitor layer may be formed on at least a portion of the second surface, and thereafter, even when the film-forming step is performed under a predetermined condition, a portion of the inhibitor layer formed on the second surface may be maintained without being removed and/or invalidated. As a result, for example, selective film growth may not be initiated on a portion of a plurality of second surfaces formed on the surface of the wafer 200. Further, for example, selective film growth may not be initiated in a partial region within the plane of the second surface.

Further, in a case where the film-forming step is continued under a predetermined condition, the inhibitor layer formed on the second surface may be removed and/or invalidated at different times across the plurality of second surfaces. As a result, depending on a timing of removal and/or invalidation of the inhibitor layer, the thickness of the film selectively formed on the second surface may not be uniform across the plurality of second surfaces. Further, as described above, the inhibitor layer formed on the second surface may be removed and/or invalidated at different times across the second surface. As a result, depending on a timing of removal and/or invalidation of the inhibitor layer, the thickness of the film selectively formed on the second surface may not be uniform across the plane of the second surface.

As a result, deterioration of characteristics of the film selectively formed on the second surface of the wafer 200, such as deterioration of step coverage, deterioration of wafer in-plane film thickness uniformity, and deterioration of surface roughness, may occur.

Therefore, in the film-forming step in the embodiments of the present disclosure, to solve the above-described problems, a process condition per cycle up to the n-th cycle (first process condition to be described later) is set to be different from a process condition per cycle on and after the (n+1)-th cycle (second process condition to be described later).

For example, in the film-forming step, an amount of exposure of the reactant to the wafer 200 per cycle up to the n-th cycle is set to be larger than an amount of exposure of the reactant to the wafer 200 per cycle on and after the (n+1)-th cycle.

Specifically, in the film-forming step, a supply time of the reactant per cycle up to the n-th cycle is set to be longer than a supply time of the reactant per cycle on and after the (n+1)-th cycle. Alternatively, in the film-forming step, the supply flow rate of the reactant up to the n-th cycle is set to be larger than the supply flow rate of the reactant on and after the (n+1)-th cycle. Alternatively, in the film-forming step, the supply time of the reactant per cycle up to the n-th cycle is set to be longer than the supply time of the reactant per cycle on and after the (n+1)-th cycle, and the supply flow rate of the reactant up to the n-th cycle is set to be larger than the supply flow rate of the reactant on and after the (n+1)-th cycle.

Further, for example, in the film-forming step, an amount of exposure of the precursor to the wafer 200 per cycle up to the n-th cycle is set to be larger than an amount of exposure of the precursor to the wafer 200 per cycle on and after the (n+1)-th cycle.

Specifically, in the film-forming step, a supply time of the precursor per cycle up to the n-th cycle is set to be longer than a supply time of the precursor per cycle on and after the (n+1)-th cycle. Alternatively, in the film-forming step, a supply flow rate of the precursor up to the n-th cycle is set to be larger than a supply flow rate of the precursor on and after the (n+1)-th cycle. Alternatively, in the film-forming step, the supply time of the precursor per cycle up to the n-th cycle is set to be longer than the supply time of the precursor per cycle on and after the (n+1)-th cycle, and the supply flow rate of the precursor up to the n-th cycle is set to be larger than the supply flow rate of the precursor on and after the (n+1)-th cycle.

Further, for example, in the film-forming step, a processing pressure in the reactant supplying step up to the n-th cycle is set to be higher than a processing pressure in the reactant supplying step on and after the (n+1)-th cycle.

Further, for example, in the film-forming step, a partial pressure of the reactant in the reactant supplying step up to the n-th cycle is set to be higher than a partial pressure of the reactant in the reactant supplying step on and after the (n+1)-th cycle.

Further, for example, in the film-forming step, a processing pressure in the precursor supplying step up to the n-th cycle is set to be equal to or higher than a processing pressure in the precursor supplying step on and after the (n+1)-th cycle.

Further, for example, in the film-forming step, a partial pressure of the precursor in the precursor supplying step up to the n-th cycle is set to be equal to or higher than the partial pressure of the precursor in the precursor supplying step on and after the (n+1)-th cycle.

In this way, by setting the process condition (first process condition) per cycle up to the n-th cycle to be different from the process condition (second process condition) per cycle on and after the (n+1)-th cycle, in the film-forming step in the embodiments of the present disclosure, it is possible to perform at least one selected from the group of removal and invalidation of the inhibitor layer formed on at least a portion of the second surface uniformly over the entire second surface until the n-th cycle. As a result, it is possible to solve the above-described matters.

An example of effects obtained by the embodiments of the present disclosure will be described below with reference to FIGS. 7A to 7D.

Figure 7A:
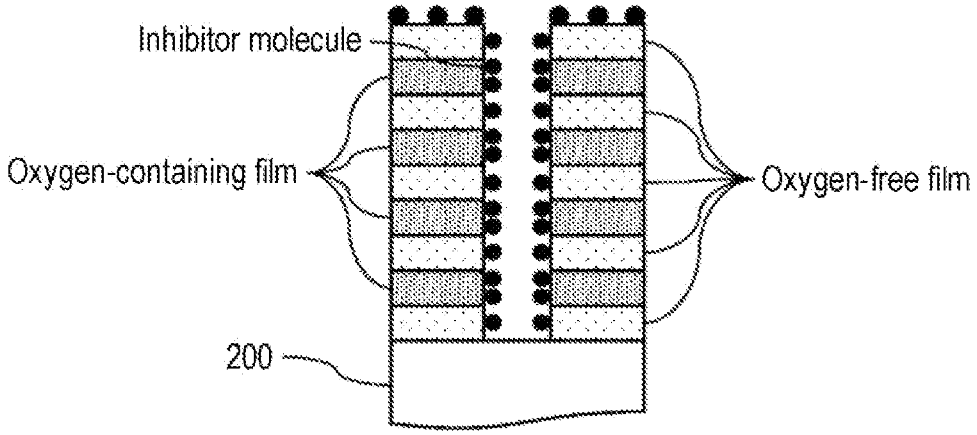
FIG. 7A is a schematic cross-sectional view showing a surface of a wafer after performing a modifying step on the wafer in which a recess is formed on the surface of the wafer and a first surface (surface of an oxygen-containing film) and a second surface (surface of an oxygen-free film) are alternately arranged on a side surface of the recess.

FIG. 7A is a schematic cross-sectional view showing a surface of the wafer 200 after performing the cleaning step and the modifying step in this order on the wafer 200 in which a recess is formed on the surface of the wafer 200 and the first surface (surface of the oxygen-containing film) and the second surface (surface of the oxygen-free film) are alternately arranged adjacent to each other on the side surface (inner side surface and inner wall) of the recess, under the above-described processing procedure and process condition. The contents shown in this figure are substantially the same as the above-described contents shown in FIG. 6A. That is, by performing the cleaning step and the modifying step in this order, the inhibitor molecules may be adsorbed on at least a portion of the second surface as well as the first surface, and therefore, the inhibitor layer may be formed on at least a portion of the second surface as well as the first surface.

Figure 7B:
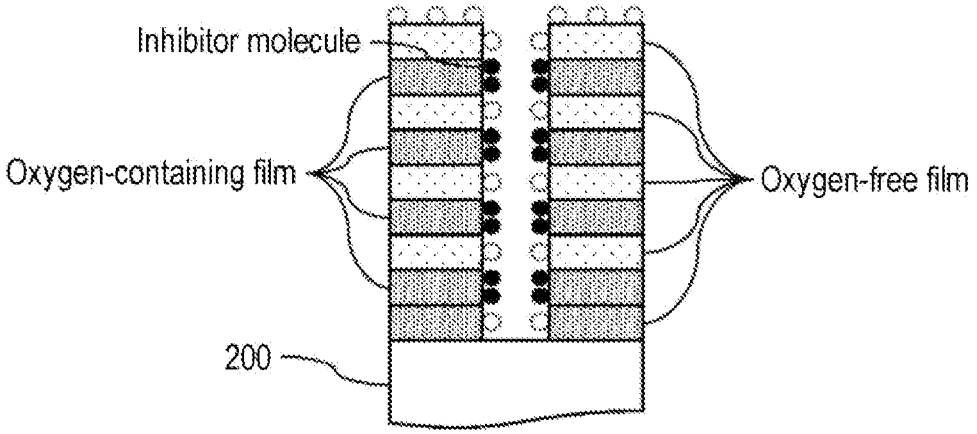
FIG. 7B is a schematic cross-sectional view showing a surface of the wafer after performing a film-forming step up to an n-th cycle, with a process condition per cycle as a predetermined first process condition, from the state of FIG. 7A.

FIG. 7B is a schematic cross-sectional view showing a surface of the wafer 200 after performing the film-forming step from the first cycle to the n-th cycle according to the above-described processing procedure, with the process condition per cycle as the first process condition to be described later, from the state of FIG. 7A. As shown in this figure, by performing the film-forming step from the first cycle to the n-th cycle under the first process condition to be described later from the state of FIG. 7A, it is possible to desorb or deactivate the inhibitor molecules adsorbed on at least a portion of the second surface from the second surface over the entire second surface until the n-th cycle. That is, it is possible to uniformly remove and/or invalidate the inhibitor layer formed on at least a portion of the second surface over the entire second surface until the n-th cycle. The second surfaces arranged on the side surface of the recess become in a state where at least a portion of the molecular structure of the molecules constituting the precursor in the precursor supplying step may be chemisorbed over the entire region of the plane of each second surface, that is, a state in which film growth (formation) is possible.

Figure 7C:
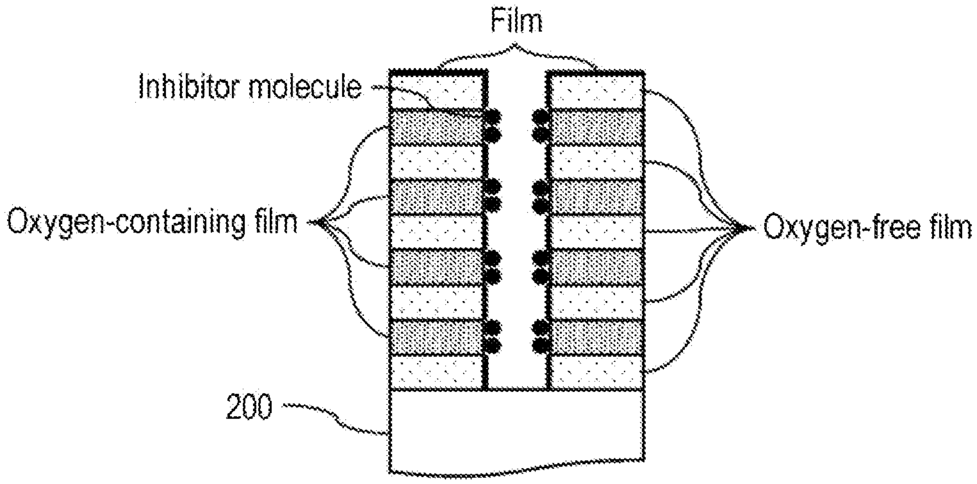
FIG. 7C is a schematic cross-sectional view showing a surface of the wafer after starting the film-forming step on and after an (n+1)-th cycle, with the process condition per cycle changed to a second process condition, which is different from the first process condition, from the state of FIG. 7B.

FIG. 7C is a schematic cross-sectional view showing a surface of the wafer 200 after starting the film-forming step on and after the (n+1)-th cycle according to the above-described processing procedure, with the process condition per cycle changed to the second process condition to be described later, which is different from the first process condition, from the state of FIG. 7B. As shown in this figure, by starting the film-forming step on and after the (n+1)-th cycle under the second process condition to be described later from the state of FIG. 7B, it is possible to initiate selective film growth on the second surface where the inhibitor layer was removed and/or invalidated, of the recess formed on the surface of the wafer 200.

As described above, the inhibitor layer formed on at least the portion of the second surface is uniformly removed and/or invalidated across the entire second surface until the n-th cycle. Therefore, the selective film growth on the second surface is initiated at the same timing on the plurality of second surfaces arranged on the side surface of the recess and on the entire region of the plane of each second surface. That is, the selective film growth on the second surface is initiated simultaneously at the same timing across the second surfaces arranged on the side surface of the recess and across the entire region of the plane of each second surface.

Figure 7D:
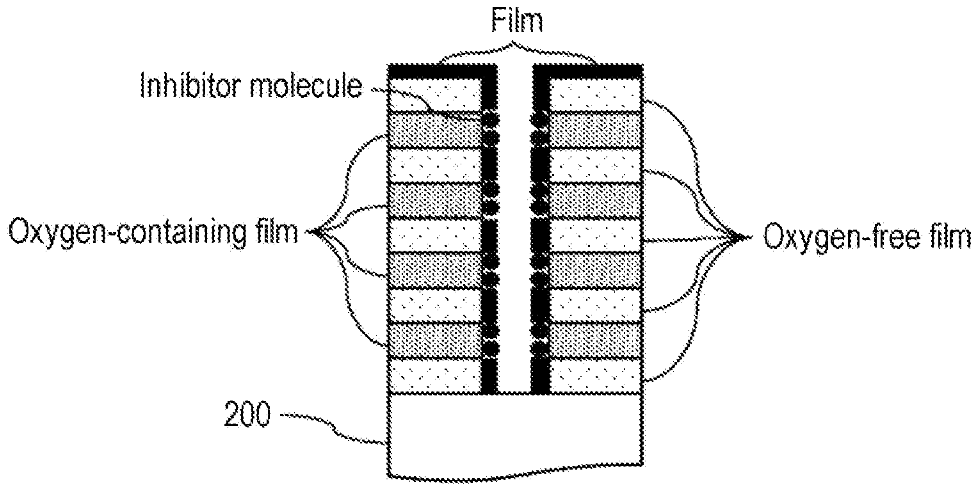
FIG. 7D is a schematic cross-sectional view showing a surface of the wafer after further continuing the film-forming step, without changing the process condition per cycle, that is, with the process condition per cycle as the second process condition, from the state of FIG. 7C.

FIG. 7D is a schematic cross-sectional view showing a surface of the wafer 200 after further continuing the film-forming step up to the n'-th cycle according to the above-described processing procedure, without changing the process condition per cycle, that is, with the process condition as the second process condition to be described later, from the state of FIG. 7C. As shown in this figure, by further continuing the film-forming step up to the n'-th cycle under the second process condition to be described later from the state of FIG. 7C, it is possible to selectively form a film with a desired thickness on the second surface where the inhibitor layer was removed and/or invalidated, of the recess formed on the surface of the wafer 200.

As described above, the selective film growth on the second surface is initiated at the same timing on the second surfaces arranged on the side surface of the recess and on the entire region of the plane of each second surface. That is, the selective film growth on the second surface is initiated simultaneously at the same timing across the second surfaces arranged on the side surface of the recess and across the entire region of the plane of each second surface. Therefore, the film formed on the second surface becomes a film covering the plurality of second surfaces arranged on the side surface of the recess and the entire region of the plane of each second surface with the same thickness. That is, the film formed on the second surface becomes a film with a uniform thickness across the second surfaces arranged on the side surface of the recess and across the entire region of the plane of each second surface. As a result, the film selectively formed on the second surface becomes a film with good step coverage and good film thickness uniformity.

Further, the film formed on the second surface becomes a film with a smooth surface as well as a uniform thickness across the entire region of the plane of the second surface. That is, the film selectively formed on the second surface becomes a film with good surface roughness.

Further, another example of effects obtained by the embodiments of the present disclosure will be described below with reference to FIGS. 8A to 8D.

Figure 8A:
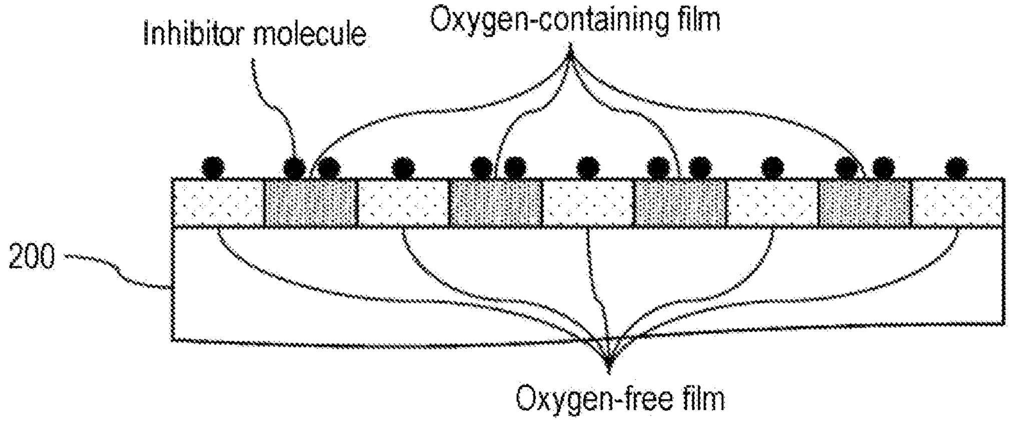
FIG. 8A is a schematic cross-sectional view showing a surface of a wafer after performing a modifying step on the wafer including a flat surface, in which a first surface (surface of an oxygen-containing film) and a second surface (surface of an oxygen-free film) are alternately arranged in parallel to the flat surface.

FIG. 8A is a schematic cross-sectional view showing a surface of the wafer 200 after performing the cleaning step and the modifying step in this order on the wafer 200 with a flat surface, in which the first surface (surface of the oxygen-containing film) and the second surface (surface of the oxygen-free film) are alternately arranged adjacent to each other in parallel to the flat surface, under the above-described processing procedure and process condition. The contents shown in this figure are substantially the same as the above-described contents shown in FIG. 6A except for a direction in which the first surface and the second surface are arranged. That is, by performing the cleaning step and the modifying step in this order, the inhibitor molecules may be adsorbed on at least a portion of the second surface as well as the first surface, and therefore, the inhibitor layer may be formed on at least a portion of the second surface as well as the first surface.

Figure 8B:
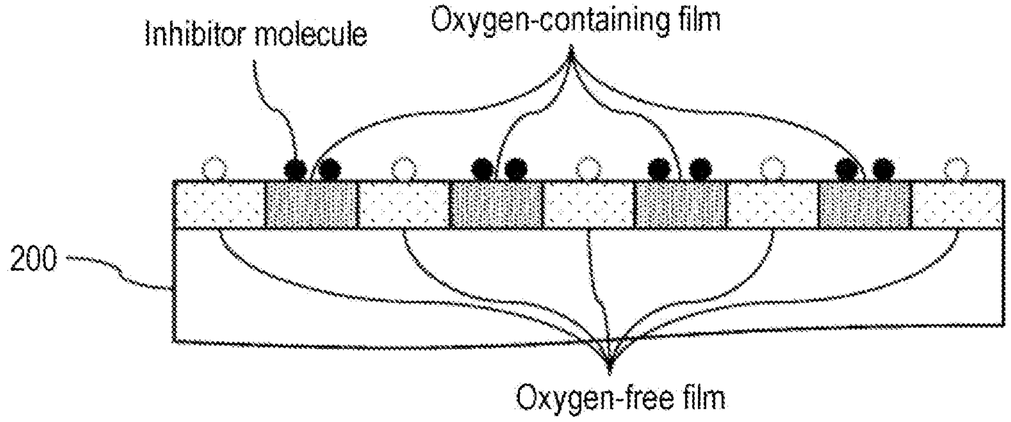
FIG. 8B is a schematic cross-sectional view showing a surface of the wafer after performing a film-forming step up to an n-th cycle, with the process condition per cycle as a predetermined first process condition, from the state of FIG. 8A.

FIG. 8B is a schematic cross-sectional view showing a surface of the wafer 200 after performing the film-forming step from the first cycle to the n-th cycle according to the above-described processing procedure, with the process condition per cycle as the first process condition to be described later, from the state of FIG. 8A. As shown in this figure, by performing the film-forming step from the first cycle to the n-th cycle under the first process condition to be described later from the state of FIG. 8A, it is possible to desorb or deactivate the inhibitor molecules adsorbed on at least a portion of the second surface from the second surface over the entire second surface until the n-th cycle, which makes it possible to uniformly remove and/or invalidate the inhibitor layer formed on at least a portion of the second surface over the entire second surface. The second surfaces arranged on the surface of the wafer 200 become in a state where film growth (formation) is possible over the entire region of the plane of each second surface.

Figure 8C:
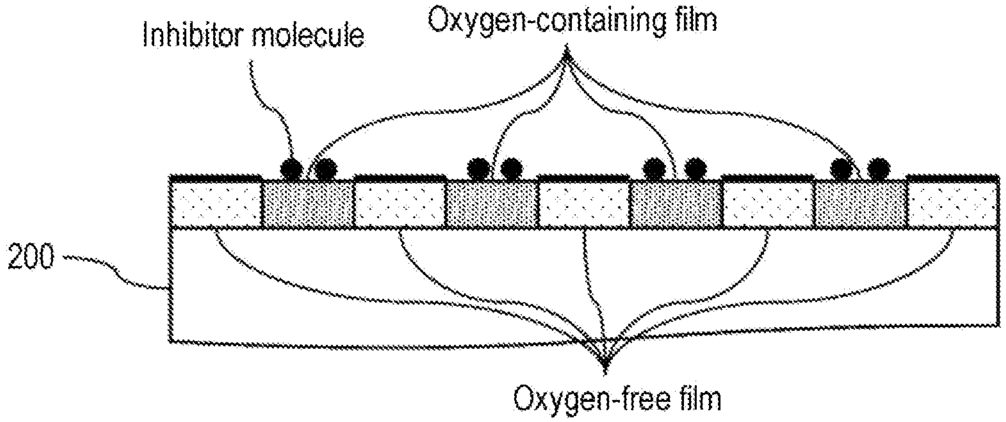
FIG. 8C is a schematic cross-sectional view showing a surface of the wafer after starting the film-forming step on and after an (n+1)-th cycle, with the process condition per cycle changed to a second process condition, which is different from the first process condition, from the state of FIG. 8B.

FIG. 8C is a schematic cross-sectional view showing a surface of the wafer 200 after starting the film-forming step on and after the (n+1)-th cycle according to the above-described processing procedure, with the process condition per cycle changed to the second process condition to be described later, which is different from the first process condition, from the state of FIG. 8B. As shown in this figure, by starting the film-forming step on and after the (n+1)-th cycle under the second process condition to be described later from the state of FIG. 8B, it is possible to initiate selective film growth on the second surface arranged on the surface of the wafer 200, where the inhibitor layer was removed and/or invalidated.

As described above, the inhibitor layer formed on at least a portion of the second surface is uniformly removed and/or invalidated across the entire second surface until the n-th cycle. Therefore, the selective film growth on the second surface is initiated at the same timing on the plurality of second surfaces arranged on the surface of the wafer 200 and on the entire region of the plane of each second surface. That is, the selective film growth on the second surface is initiated simultaneously at the same timing across the second surfaces arranged on the surface of the wafer 200 and across the entire region of the plane of each second surface.

Figure 8D:
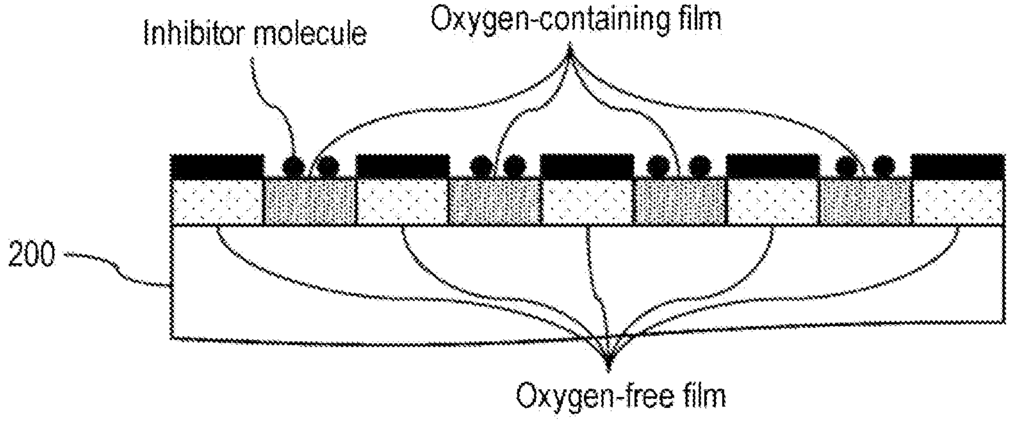
FIG. 8D is a schematic cross-sectional view showing a surface of the wafer after further continuing the film-forming step, without changing the process condition per cycle, that is, with the process condition per cycle as the second process condition, from the state of FIG. 8C.

FIG. 8D is a schematic cross-sectional view showing a surface of the wafer 200 after further continuing the film-forming step up to the n'-th cycle according to the above-described processing procedure, without changing the process condition per cycle, that is, with the process condition as the second process condition to be described later, from the state of FIG. 8C. As shown in this figure, by further continuing the film-forming step up to the n'-th cycle under the second process condition to be described later from the state of FIG. 8C, it is possible to selectively form a film with a desired thickness on the second surface arranged on the surface of the wafer 200, where the inhibitor layer was removed and/or invalidated.

As described above, the selective film growth on the second surface is initiated at the same timing on the second surfaces arranged on the surface of the wafer 200 and on the entire region of the plane of each second surface. That is, the selective film growth on the second surface is initiated simultaneously at the same timing across the second surfaces arranged on the surface of the wafer 200 and across the entire region of the plane of each second surface. Therefore, the film formed on the second surface becomes a film covering the plurality of second surfaces arranged on the surface of the wafer 200 and the entire region of the plane of each second surface with the same thickness. That is, the film formed on the second surface becomes a film with a uniform thickness across the second surfaces arranged on the surface of the wafer 200 and across the entire region of the plane of each second surface. As a result, the film selectively formed on the second surface becomes a film with a good wafer in-plane film thickness uniformity.

Further, the film formed on the second surface becomes a film with a smooth surface as well as a uniform thickness across the entire region of the plane of the second surface. That is, the film selectively formed on the second surface becomes a film with good surface roughness.

As described above, in the film-forming step in the embodiments of the present disclosure, by setting the process condition per cycle (first process conditions) up to the n-th cycle to be different from the process condition (second process condition) per cycle on and after the (n+1)-th cycle, it is possible to improve characteristics of the film selectively formed on the second surface.

A process condition (first process condition) per cycle up to the n-th cycle of the film-forming step is exemplified as follows.

(When Supplying Precursor and Catalyst in Precursor Supplying Step)

Processing temperature: room temperature (25 degrees C.) to 200 degrees C., specifically room temperature to 150 degrees C., Processing pressure: 133 to 2,666 Pa, Supply flow rate of precursor: 0.1 to 3 slm, Supply flow rate of catalyst: 0.1 to 3 slm, Supply flow rate of inert gas (for each gas supply pipe): 0 to 20 slm, Partial pressure of precursor: 0.58 to 2,580 Pa, and Supply time of each gas: 30 to 600 seconds, specifically 60 to 300 seconds.

(When Supplying Reactant and Catalyst in Reactant Supplying Step)

Processing temperature: room temperature (25 degrees C.) to 200 degrees C., specifically room temperature to 150 degrees C., Processing pressure: 133 to 2,666 Pa, Supply flow rate of reactant: 0.1 to 3 slm, Supply flow rate of catalyst: 0.1 to 3 slm, Supply flow rate of inert gas (for each gas supply pipe): 0 to 20 slm, Partial pressure of reactant: 0.58 to 2,580 Pa. and Supply time of each gas: 30 to 600 seconds, specifically 60 to 300 seconds.

A process condition (second process condition) per cycle on and after the (n+1)-th cycle of the film-forming step is exemplified as follows.

(When Supplying Precursor and Catalyst in Precursor Supplying Step)

Processing temperature: room temperature (25 degrees C.) to 200 degrees C., specifically room temperature to 150 degrees C., Processing pressure: 133 to 1,333 Pa, Supply flow rate of precursor: 0.001 to 2 slm, Supply flow rate of catalyst: 0.001 to 2 slm, Supply flow rate of inert gas (for each gas supply pipe): 0 to 20 slm, Partial pressure of precursor: 0.006 to 1,332 Pa, and Supply time of each gas: 1 to 180 seconds, specifically 1 to 100 seconds.

(When Supplying Reactant and Catalyst in Reactant Supplying Step)

Processing temperature: room temperature (25 degrees C.) to 200 degrees C., specifically room temperature to 150 degrees C., Processing pressure: 133 to 1,333 Pa, Supply flow rate of reactant: 0.001 to 2 slm, Supply flow rate of catalyst: 0.001 to 2 slm, Supply flow rate of inert gas (for each gas supply pipe): 0 to 20 slm, Partial pressure of reactant: 0.006 to 1,332 Pa, and Supply time of each gas: 1 to 180 seconds, specifically 1 to 100 seconds.

Further, in the film-forming step, the supply time of the precursor per cycle up to the n-th cycle may be set to be longer than the supply time of the reactant per cycle up to the n-th cycle.

Further, in the film-forming step, the supply time of the reactant per cycle up to the n-th cycle may be set to be longer than the supply time of the precursor per cycle up to the n-th cycle.

Further, in the film-forming step, the processing pressure in the reactant supplying step on and after the (n+1)-th cycle may be set to be equal to or lower than the processing pressure in the precursor supplying step on and after the (n+1)-th cycle.

Further, in the film-forming step, the number of cycles up to the n-th cycle may be set to be smaller than the number of cycles on and after the (n+1)-th cycle.

Further, in the film-forming step, the number of cycles up to the n-th cycle may be set to be 1 or more and 10 or less.

In a case where the number of cycles up to the n-th cycle is set to be 11 or more, the inhibitor layer formed on the first surface may be easily removed and/or invalidated, which may decrease the selectivity. By setting the number of cycles to be 10 or less, the removal and/or invalidation of the inhibitor layer formed on the first surface may be effectively suppressed, which makes it possible to effectively suppress the decrease in selectivity. By setting the number of cycles to be 5 or less, the removal and/or invalidation of the inhibitor layer formed on the first surface may be more effectively suppressed, which makes it possible to more effectively suppress the decrease in selectivity. By setting the number of cycles to be 3 or less, the removal and/or invalidation of the inhibitor layer formed on the first surface may be even more effectively suppressed, which makes it possible to even more effectively suppress the decrease in selectivity.

(Heat-Treating Step)

After performing the film-forming step, heat treatment is performed on the wafer 200 after selectively forming the film on the second surface. At this time, an output of the heater 207 is regulated such that an internal temperature of the process chamber 201, that is, a temperature of the wafer 200 after selectively forming the film on the second surface, is set to be equal to or higher than the temperature of the wafer 200 in the cleaning step, the modifying step, and the film-forming step, specifically to be higher than the temperature of the wafer 200 in these steps.

By performing the heat treatment (annealing treatment) on the wafer 200, impurities contained in the film formed on the second surface of the wafer 200 in the film-forming step may be removed and defects in the film may be repaired, which may harden the film. By hardening the film, a processing resistance of the film, that is, an etching resistance, may be improved. In a case where for the film formed on the second surface, removal of impurities, repair of defects, hardening of the film, or the like may not be performed, the annealing treatment, that is, the heat-treating step, may be omitted.

Further, according to this step, the inhibitor layer remaining on the first surface of the wafer 200 after performing the film-forming step may be heat-treated (anneal-treated). This allows at least a portion of the inhibitor layer remaining on the first surface to be removed and/or invalidated.

Figure 5E:
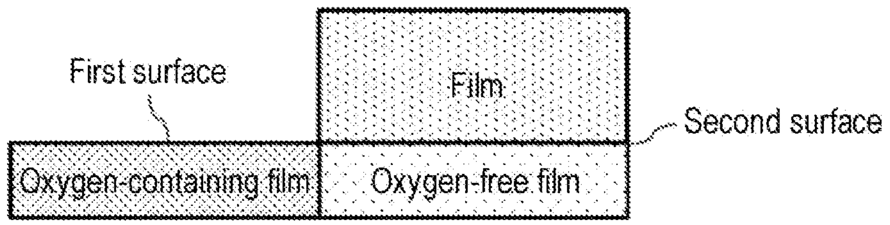
FIG. 5E is a schematic cross-sectional view showing a surface of the wafer after the inhibitor layer on the first surface is removed by performing a heat-treating step from the state of FIG. 5D.

As described above, by performing this step, as shown in FIG. 5E, the film formed on the second surface of the wafer 200 is hardened by the heat treatment, and at least a portion of the inhibitor layer formed on the first surface of the wafer 200 is removed and/or invalidated. That is, by performing this step, the heat-treated film is present on the second surface, and at least a portion of the first surface is exposed. FIG. 5E shows an example in which the inhibitor layer formed on the first surface is desorbed and removed to expose the first surface.

Further, this step may be performed in a state where an inert gas is supplied into the process chamber 201, or may be performed in a state where a reactive substance such as an oxidizing agent (oxidizing gas) is supplied into the process chamber 201. In this case, the inert gas and the reactive substance such as the oxidizing agent (oxidizing gas) are also referred to as an assist substance.

A process condition when performing the heat-treating step is exemplified as follows:

Processing temperature: 200 to 1,000 degrees C., specifically 400 to 700 degrees C., Processing pressure: 1 to 120,000 Pa, Processing time: 1 to 18,000 seconds, and Supply flow rate of assist substance: 0 to 50 slm.

(After-Purge and Returning to Atmospheric Pressure)

After the heat-treating step is completed, an inert gas acting as a purge gas is supplied into the process chamber 201 from each of the nozzles 249*a* to 249*c* and is exhausted via the exhaust port 231*a*. Thus, the interior of the process chamber 201 is purged and a gas, reaction by-products, and the like remaining in the process chamber 201 are removed from the interior of the process chamber 201 (after-purge). After that, the internal atmosphere of the process chamber 201 is substituted with an inert gas (inert gas substitution) and the internal pressure of the process chamber 201 is returned to the atmospheric pressure (returning to atmospheric pressure).

(Boat Unloading and Wafer Discharging)

After that, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219*s* is moved and the lower end opening of the manifold 209 is sealed by the shutter 219*s* via the O-ring 220*c* (shutter close). The processed wafers 200 are unloaded from the reaction tube 203 and are then discharged from the boat 217 (wafer discharging).

The cleaning step, the modifying step, the film-forming step, and the heat-treating step may be performed in the same process chamber (in-situ). As a result, after the surface of the wafer 200 is cleaned by the cleaning step (after the native oxide film is removed), without exposing the wafer 200 to the atmosphere, that is, with the surface of the wafer 200 kept clean, the modifying step, the film-forming step, and the heat-treating step may be performed, which makes it possible to appropriately perform selective growth. That is, by performing these steps in the same process chamber, it is possible to perform the selective growth with high selectivity. Further, when the cleaning step may be omitted as described above, the modifying step, the film-forming step, and the heat-treating step may be performed in the same process chamber. Further, when the heat-treating step may be omitted as described above, the modifying step and the film-forming step may be performed in the same process chamber.

(3) Effects of the Embodiments of the Present Disclosure

According to the embodiments of the present disclosure, one or more effects set forth below may be achieved.

(a) In the film-forming step, by setting the process condition per cycle up to the n-th cycle to be different from the process condition per cycle on and after the (n+1)-th cycle, it is possible to uniformly remove and/or invalidate the inhibitor layer formed on at least a portion of the second surface over the entire second surface until the n-th cycle. As a result, it is possible to shorten an incubation time for forming a film on the second surface over the entire second surface and to improve characteristics of the film formed on the second surface, such as the step coverage, wafer in-plane film thickness uniformity, surface roughness, and the like. Further, since the incubation time for forming the film on the second surface may be shortened over the entire second surface, it is possible to effectively shorten a total processing time, thereby improving a productivity.

Further, in the film-forming step, by setting the process condition per cycle on and after the (n+1)-th cycle to be different from the process condition per cycle up to the n-th cycle, it is possible to form a film on the second surface while suppressing the inhibitor layer formed on the first surface from being removed and/or invalidated on and after the (n+1)-th cycle, which makes it possible to suppress a decrease in selectivity.

(b) In the film-forming step, by setting the amount of exposure of the reactant to the wafer 200 per cycle up to the n-th cycle to be larger than the amount of exposure of the reactant to the wafer 200 per cycle on and after the (n+1)-th cycle, it is possible to effectively remove and/or invalidate the inhibitor layer formed on at least a portion of the second surface uniformly over the entire second surface until the n-th cycle. As a result, it is possible to effectively shorten the incubation time for forming a film on the second surface over the entire second surface and to effectively improve characteristics of the film formed on the second surface, such as the step coverage, wafer in-plane film thickness uniformity, surface roughness, etc. Further, since the incubation time for forming the film on the second surface may be effectively shortened over the entire second surface, it is possible to effectively shorten the total processing time, thereby effectively improving the productivity.

Further, in the film-forming step, by setting the amount of exposure of the reactant to the wafer 200 per cycle on and after the (n+1)-th cycle to be smaller than the amount of exposure of the reactant to the wafer 200 per cycle up to the n-th cycle, it is possible to form a film on the second surface while effectively suppressing the inhibitor layer formed on the first surface from being removed and/or invalidated on and after the (n+1)-th cycle, which makes it possible to effectively suppress a decrease in selectivity.

Further, in the film-forming step, by setting the supply time of the reactant per cycle up to the n-th cycle to be longer than the supply time of the reactant per cycle on and after the (n+1)-th cycle, it is possible to effectively obtain the above-described effects. Further, by setting the supply flow rate of the reactant up to the n-th cycle to be larger than the supply flow rate of the reactant on and after the (n+1)-th cycle, it is possible to effectively obtain the above-described effects. Further, by setting the supply time of the reactant per cycle up to the n-th cycle to be longer than the supply time of the reactant per cycle on and after the (n+1)-th cycle and setting the supply flow rate of the reactant up to the n-th cycle to be larger than the supply flow rate of the reactant on and after the (n+1)-th cycle, it is possible to more effectively obtain the above-described effects.

(c) In the film-forming step, by setting the amount of exposure of the precursor to the wafer 200 per cycle up to the n-th cycle to be larger than the amount of exposure of the precursor to the wafer 200 per cycle on and after the (n+1)-th cycle, it is possible to effectively remove and/or invalidate the inhibitor layer formed on at least a portion of the second surface uniformly over the entire second surface until the n-th cycle. As a result, it is possible to effectively shorten the incubation time for forming a film on the second surface over the entire second surface and to effectively improve the characteristics of the film formed on the second surface, such as the step coverage, wafer in-plane film thickness uniformity, surface roughness, etc. Further, since the incubation time for forming the film on the second surface may be effectively shortened over the entire second surface, it is possible to effectively shorten the total processing time, thereby effectively improving the productivity.

Further, in the film-forming step, by setting the amount of exposure of the precursor to the wafer 200 per cycle on and after the (n+1)-th cycle to be smaller than the amount of exposure of the precursor to the wafer 200 per cycle up to the n-th cycle, it is possible to form a film on the second surface while effectively suppressing the inhibitor layer formed on the first surface from being removed and/or invalidated on and after the (n+1)-th cycle, which makes it possible to effectively suppress a decrease in selectivity.

Further, in the film-forming step, by setting the supply time of the precursor per cycle up to the n-th cycle to be longer than the supply time of the precursor per cycle on and after the (n+1)-th cycle, it is possible to effectively obtain the above-described effects. Further, in the film-forming step, by setting the supply flow rate of the precursor up to the n-th cycle to be larger than the supply flow rate of the precursor on and after the (n+1)-th cycle, it is possible to effectively obtain the above-described effects. Further, in the film-forming step, by setting the supply time of the precursor per cycle up to the n-th cycle to be longer than the supply time of the precursor per cycle on and after the (n+1)-th cycle and setting the supply flow rate of the precursor up to the n-th cycle to be larger than the supply flow rate of the precursor on and after the (n+1)-th cycle, it is possible to more effectively obtain the above-described effects.

(d) In the film-forming step, by setting the processing pressure in the reactant supplying step up to the n-th cycle to be higher than the processing pressure in the reactant supplying step on and after the (n+1)-th cycle, it is possible to effectively remove and/or invalidate the inhibitor layer formed on at least a portion of the second surface uniformly over the entire second surface until the n-th cycle. As a result, it is possible to effectively shorten the incubation time for forming a film on the second surface over the entire second surface and to effectively improve the characteristics of the film formed on the second surface, such as the step coverage, wafer in-plane film thickness uniformity, surface roughness, etc. Further, since the incubation time for forming the film on the second surface may be effectively shortened over the entire second surface, it is possible to effectively shorten the total processing time, thereby effectively improving the productivity.

Further, in the film-forming step, by setting the processing pressure in the reactant supplying step on and after the (n+1)-th cycle to be lower than the processing pressure in the reactant supplying step up to the n-th cycle, it is possible to form a film on the second surface while effectively suppressing the inhibitor layer formed on the first surface from being removed and/or invalidated on and after the (n+1)-th cycle, which makes it possible to effectively suppress a decrease in selectivity.

(e) In the film-forming step, by setting the partial pressure of the reactant in the reactant supplying step up to the n-th cycle to be higher than the partial pressure of the reactant in the reactant supplying step on and after the (n+1)-th cycle, it is possible to effectively remove and/or invalidate the inhibitor layer formed on at least a portion of the second surface uniformly over the entire second surface until the n-th cycle. As a result, it is possible to effectively shorten the incubation time for forming a film on the second surface over the entire second surface and to effectively improve the characteristics of the film formed on the second surface, such as the step coverage, wafer in-plane film thickness uniformity, surface roughness, etc. Further, since the incubation time for forming the film on the second surface may be effectively shortened over the entire second surface, it is possible to effectively shorten the total processing time, thereby effectively improving the productivity.

Further, in the film-forming step, by setting the partial pressure of the reactant in the reactant supplying step on and after the (n+1)-th cycle to be lower than the partial pressure of the reactant in the reactant supplying step up to the n-th cycle, it is possible to form a film on the second surface while effectively suppressing the inhibitor layer formed on the first surface from being removed and/or invalidated on and after the (n+1)-th cycle, which makes it possible to effectively suppress a decrease in selectivity.

(f) In the film-forming step, by setting the processing pressure in the precursor supplying step up to the n-th cycle to be equal to or higher than the processing pressure in the precursor supplying step on and after the (n+1)-th cycle, it is possible to effectively remove and/or invalidate the inhibitor layer formed on at least a portion of the second surface uniformly over the entire second surface until the n-th cycle. As a result, it is possible to effectively shorten the incubation time for forming a film on the second surface over the entire second surface and to effectively improve the characteristics of the film formed on the second surface, such as the step coverage, wafer in-plane film thickness uniformity, surface roughness, etc. Further, since the incubation time for forming the film on the second surface may be effectively shortened over the entire second surface, it is possible to effectively shorten the total processing time, thereby effectively improving the productivity.

Further, in the film-forming step, by setting the processing pressure in the precursor supplying step on and after the (n+1)-th cycle to be equal to or lower than the processing pressure in the precursor supplying step up to the n-th cycle, it is possible to form a film on the second surface while effectively suppressing the inhibitor layer formed on the first surface from being removed and/or invalidated on and after the (n+1)-th cycle, which makes it possible to effectively suppress a decrease in selectivity.

Further, in the film-forming step, by setting the processing pressure in the precursor supplying step up to the n-th cycle to be higher than the processing pressure in the precursor supplying step on and after the (n+1)-th cycle, it is possible to further enhance these effects.

(g) In the film-forming step, by setting the partial pressure of the precursor in the precursor supplying step up to the n-th cycle to be equal to or higher than the partial pressure of the precursor in the precursor supplying step on and after the (n+1)-th cycle, it is possible to effectively remove and/or invalidate the inhibitor layer formed on at least a portion of the second surface uniformly over the entire second surface until the n-th cycle. As a result, it is possible to effectively shorten the incubation time for forming a film on the second surface over the entire second surface and to effectively improve the characteristics of the film formed on the second surface, such as the step coverage, wafer in-plane film thickness uniformity, surface roughness, etc. Further, since the incubation time for forming the film on the second surface may be effectively shortened over the entire second surface, it is possible to effectively shorten the total processing time, thereby effectively improving the productivity.

Further, in the film-forming step, by setting the partial pressure of the precursor in the precursor supplying step on and after the (n+1)-th cycle to be equal to or lower than the partial pressure of the precursor in the precursor supplying step up to the n-th cycle, it is possible to form a film on the second surface while effectively suppressing the inhibitor layer formed on the first surface from being removed and/or invalidated on and after the (n+1)-th cycle, which makes it possible to effectively suppress a decrease in selectivity.

Further, in the film-forming step, by setting the partial pressure of the precursor in the precursor supplying step up to the n-th cycle to be higher than the partial pressure of the precursor in the precursor supplying step on and after the (n+1)-th cycle, it is possible to further enhance these effects.

(h) In the film-forming step, by setting the supply time of the precursor per cycle up to the n-th cycle to be longer than the supply time of the reactant per cycle up to the n-th cycle, it is possible to mildly remove and/or invalidate the inhibitor layer formed on at least a portion of the second surface uniformly over the entire second surface until the n-th cycle. As a result, it is possible to further suppress removal and/or invalidation of the inhibitor layer formed on the first surface, which makes it possible to further suppress a decrease in selectivity.

(i) In the film-forming step, by setting the supply time of the reactant per cycle up to the n-th cycle to be longer than the supply time of the precursor per cycle up to the n-th cycle, it is possible to effectively remove and/or invalidate the inhibitor layer formed on at least a portion of the second surface uniformly over the entire second surface until the n-th cycle. As a result, it is possible to effectively shorten the incubation time for forming a film on the second surface over the entire second surface and to effectively improve the characteristics of the film formed on the second surface, such as the step coverage, wafer in-plane film thickness uniformity, surface roughness, etc. Further, since the incubation time for forming the film on the second surface may be effectively shortened over the entire second surface, it is possible to effectively shorten the total processing time, thereby effectively improving the productivity.

(j) In the film-forming step, by setting the processing pressure in the reactant supplying step on and after the (n+1)-th cycle to be equal to or lower than the processing pressure in the precursor supplying step on and after the (n+1)-th cycle, it is possible to form a film on the second surface while further suppressing the inhibitor layer formed on the first surface from being removed and/or invalidated on and after the (n+1)-th cycle, which makes it possible to further suppress a decrease in selectivity. Further, in the film-forming step, by setting the processing pressure in the reactant supplying step on and after the (n+1)-th cycle to be lower than the processing pressure in the precursor supplying step on and after the (n+1)-th cycle, it is possible to further enhance these effects.

(k) In the film-forming step, by setting the number of cycles up to the n-th cycle to be smaller than the number of cycles on and after the (n+1)-th cycle, it is possible to further suppress removal and/or invalidation of the inhibitor layer formed on the first surface until the n-th cycle, which makes it possible to further suppress a decrease in selectivity.

(l) In the film-forming step, by setting the number of cycles up to the n-th cycle to 1 or more and 10 or less, it is possible to further suppress removal and/or invalidation of the inhibitor layer formed on the first surface until the n-th cycle, which makes it possible to further suppress a decrease in selectivity.

(m) In the film-forming step, by performing a cycle including the precursor supplying step and the reactant supplying step a predetermined number of times, it is possible to progress selective film growth on the second surface with good controllability.

(n) The above-described effects may be obtained particularly remarkably in a case where a recess is formed on the surface of the wafer 200 and the first surface and the second surface are alternately arranged on the side surface of the recess. Further, the above-described effects may be obtained particularly remarkably even in a case where the first surface and the second surface are alternately arranged in the plane of the wafer 200. Further, the above-described effects may be obtained particularly remarkably in a case where the first surface includes an oxygen-containing film and the second surface includes an oxygen-free film. Further, the above-described effects may be obtained in the same way when arbitrarily selecting and using a predetermined substance (gaseous substance or liquefied substance) from the above-mentioned various cleaning agents, various modifying agents, various precursors, various reactants, various catalysts, and various inert gases.

(4) Modifications

The substrate processing sequence in the embodiments of the present disclosure may be changed as in the following modifications. Unless otherwise stated, a processing procedure and a process condition in each step of the modifications may be the same as the processing procedure and process condition in each step of the above-described substrate processing sequence.

A processing sequence in this modification includes:

a step of supplying a modifying agent to a wafer 200 including a first surface and a second surface to form an inhibitor layer on the first surface and at least a portion of the second surface (modifying step);

a step of supplying a reactant to the wafer 200 to perform at least one selected from the group of removal and invalidation of the inhibitor layer formed on the at least a portion of the second surface (film formation preparing step); and a step of supplying a film-forming agent to the wafer 200 to form a film on the second surface (film-forming step).

Each step is performed in a non-plasma atmosphere.

Figure 9:
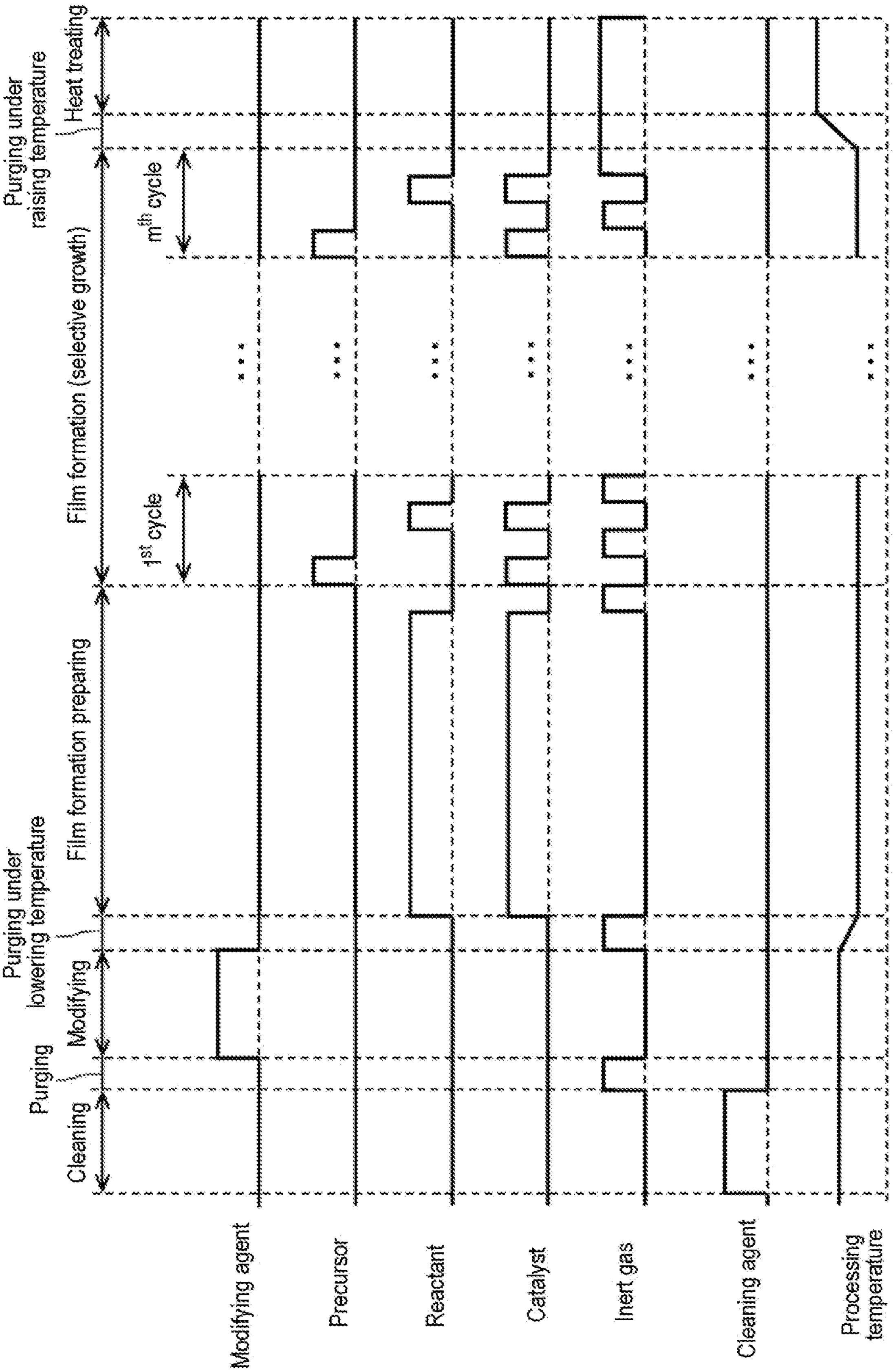
FIG. 9 is a diagram showing a modification of a processing sequence according to embodiments of the present disclosure.

In this modification, as shown in FIG. 9 and the processing sequence shown below, a case where the film-forming agent contains a precursor and a reactant and, in the film-forming step, a cycle including a step of supplying the precursor to the wafer 200 (precursor supplying step) and a step of supplying the reactant to the wafer 200 (reactant supplying step) is performed a predetermined number of times (m times, where m is an integer of 1 or 2 or more) will be described.

Further, in this modification, a case where a catalyst is supplied to the wafer 200 in at least one selected from the group of the film formation preparing step, the precursor supplying step, and the reactant supplying step will be described. As a representative example, an example in which the catalyst is supplied in the entire steps of the film formation preparing step, the precursor supplying step, and the reactant supplying step is shown in FIG. 9 and the processing sequence shown below.

Modifying agent→Reactant+Catalyst→(Precursor+Catalyst→Reactant+Catalyst)×m

Further, as in the processing sequence shown below, depending on process conditions, the catalyst may not be supplied, or the catalyst may be supplied to the wafer 200 in at least one selected from the group of the film formation preparing step, the precursor supplying step, and the reactant supplying step.

Modifying agent→Reactant→(Precursor→Reactant)×m

Modifying agent→Reactant→(Precursor+Catalyst→Reactant)×m

Modifying agent→Reactant→(Precursor→Reactant+Catalyst)×m

Modifying agent→Reactant→(Precursor+Catalyst→Reactant+Catalyst)×m

Modifying agent→Reactant+Catalyst→(Precursor→Reactant)×m

Modifying agent→Reactant+Catalyst→(Precursor+Catalyst→Reactant)×m

Modifying agent→Reactant+Catalyst→(Precursor→Reactant+Catalyst)×m

Modifying agent→Reactant+Catalyst→(Precursor+Catalyst→Reactant+Catalyst)×m

Further, as in FIG. 9 and the processing sequence shown below, before performing the modifying step, a cleaning step may be further performed. Moreover, after performing the step of forming the film, a heat-treating step may be further performed.

Cleaning agent→Modifying agent→Reactant→(Precursor→Reactant)×m→Heat treatment

Cleaning agent→Modifying agent→Reactant→(Precursor+Catalyst→Reactant)×m→Heat treatment Cleaning agent→Modifying agent→Reactant→(Precursor→Reactant+Catalyst)×m→Heat treatment Cleaning agent→Modifying agent→Reactant→(Precursor+Catalyst→Reactant+Catalyst)×m→Heat treatment Cleaning agent→Modifying agent→Reactant+Catalyst→(Precursor→Reactant)×m→Heat treatment Cleaning agent→Modifying agent→Reactant+Catalyst→(Precursor+Catalyst→Reactant)×m→Heat treatment Cleaning agent→Modifying agent→Reactant+Catalyst→(Precursor→Reactant+Catalyst)×m→Heat treatment Cleaning agent→Modifying agent→Reactant+Catalyst→(Precursor+Catalyst→Reactant+Catalyst)×m→Heat treatment The processing procedure in the film formation preparing step may be the same as the processing procedure in the reactant supplying step of the above-described embodiments. The processing procedures in the precursor supplying step and the reactant supplying step of this modification may be the same as the processing procedures in the precursor supplying step and the reactant supplying step of the above-described embodiments, respectively.

A process condition in the film formation preparing step is exemplified as follows:

Processing temperature: room temperature (25 degrees C.) to 200 degrees C., specifically room temperature to 150 degrees C., Processing pressure: 133 to 2,666 Pa, Supply flow rate of reactant: 0.1 to 3 slm,
Supply flow rate of catalyst: 0.1 to 3 slm,
Supply flow rate of inert gas (for each gas supply pipe): 0 to 20 slm, and
Partial pressure of reactant: 0.58 to 2,580 Pa.
Supply time of each gas: 60 to 1,800 seconds, specifically 60 to 900 seconds.

As the process condition in the film-forming step, for example, the same process condition as the above-described second process condition may be used.

Also in this modification, by sequentially performing the modifying step, the film formation preparing step, and the film-forming step, it is possible to selectively (preferentially) form a film on the second surface among the first surface and the second surface of the wafer 200.

Even in this modification, an inhibitor layer may be formed on at least a portion of the second surface when performing the modifying step, which may cause occurrence of the matters described above with reference to FIGS. 6A to 6D. In contrast, according to this modification, these matters may be solved by performing the film formation preparing step under the above-described process condition after the modifying step and before the film-forming step, such that substantially the same effects as the above-described embodiments may be obtained.

That is, in this modification, by performing the film formation preparing step under the above-described process condition, it is possible to remove and/or invalidate the inhibitor layer formed on at least the portion of the second surface uniformly over the entire second surface. This makes it possible to shorten the incubation time for forming a film on the second surface over the entire second surface. As a result, by performing the film-forming step, it is possible to improve the characteristics of the film formed on the second surface, such as the step coverage, in-plane film thickness uniformity, surface roughness, etc. Further, since the incubation time for forming the film on the second surface may be shortened over the entire second surface, it is possible to shorten s total processing time, thereby improving a productivity.

Further, in this modification, in the film-forming step, by performing a cycle including the precursor supplying step and the reactant supplying step a predetermined number of times, it is possible to progress selective film growth on the second surface with good controllability in the same manner as in the above-described embodiments.

Further, in this modification, an amount of exposure of the reactant to the wafer 200 in the film formation preparing step may be set to be larger than an amount of exposure of the reactant to the wafer 200 per cycle in the film-forming step.

That is, a supply time of the reactant in the film formation preparing step may be set to be longer than a supply time of the reactant per cycle in the film-forming step. Alternatively, a supply flow rate of the reactant in the film formation preparing step may be set to be larger than a supply flow rate of the reactant in the film-forming step. Alternatively, the supply time of the reactant in the film formation preparing step may be set to be longer than the supply time of the reactant per cycle in the film-forming step, and the supply flow rate of the reactant in the film formation preparing step may be set to be larger than the supply flow rate of the reactant in the film-forming step.

In these cases, in the film formation preparing step, it is possible to effectively remove and/or invalidate the inhibitor layer formed on at least a portion of the second surface uniformly over the entire second surface. This makes it possible to effectively shorten the incubation time for forming the film on the second surface over the entire second surface and to effectively improve the characteristics of the film formed on the second surface by performing the film-forming step, such as the step coverage, wafer in-plane film thickness uniformity, surface roughness, etc. Further, since the incubation time for forming the film on the second surface may be effectively shortened over the entire second surface, it is possible to effectively shorten the total processing time, thereby effectively improving the productivity.

Further, in these cases, in the film-forming step, by setting the amount of exposure of the reactant to the wafer 200 per cycle in the film-forming step to be smaller than the amount of exposure of the reactant to the wafer 200 in the film formation preparing step, it is possible to form a film on the second surface while effectively suppressing the inhibitor layer formed on the first surface from being removed and/or invalidated, which makes it possible to effectively suppress a decrease in selectivity.

Further, in this modification, a processing pressure in the film formation preparing step may be set to be higher than a processing pressure in the reactant supplying step. Alternatively, a partial pressure of the reactant in the film formation preparing step may be set to be higher than a partial pressure of the reactant in the reactant supplying step. Alternatively, the processing pressure in the film formation preparing step may be set to be higher than the processing pressure in the reactant supplying step, and the partial pressure of the reactant in the film formation preparing step may be set to be higher than the partial pressure of the reactant in the reactant supplying step.

In these cases, the film formation preparing step, it is possible to effectively remove and/or invalidate the inhibitor layer formed on at least a portion of the second surface uniformly over the entire second surface. This makes it possible to effectively shorten the incubation time for forming a film on the second surface over the entire second surface and to effectively improve the characteristics of the film formed on the second surface by performing the film-forming step, such as the step coverage, wafer in-plane film thickness uniformity, surface roughness, etc. Further, since the incubation time for forming the film on the second surface may be effectively shortened over the entire second surface, it is possible to effectively shorten the total processing time, thereby effectively improving the productivity.

In these cases, in the film-forming step, by setting the processing pressure in the reactant supplying step to be lower than the processing pressure in the film formation preparing step, it is possible to form a film on the second surface while effectively suppressing the inhibitor layer formed on the first surface from being removed and/or invalidated, which makes it possible to effectively suppress a decrease in selectivity.

Other Embodiments of the Present Disclosure

The embodiments of the present disclosure are specifically described above. However, the present disclosure is not limited to the above-described embodiments, and various changes may be made without departing from the gist thereof.

For example, the wafer 200 may include at least one selected from the group of an oxygen-containing film and a metal-containing film as a first surface, and may include at least one selected from the group of an oxygen-free film and a metal-free film as a second surface. Further, for example, the wafer 200 may include a plurality of types of regions made of different materials as the first surface, and may include a plurality of types of regions made of different materials as the second surface. The region (bases) constituting the first surface and the second surface may include, in addition to the above-mentioned SiO film and SiN film, films containing semiconductor elements, such as a silicon oxycarbonitride film (SiOCN film), a silicon oxycarbide film (SiOC film), a silicon oxynitride film (SiON film), a silicon carbonitride film (SiCN film), a silicon carbide film (SiC film), a silicon borocarbonitride film (SiBCN film), a silicon boronitride film (SiBN film), a silicon borocarbide film (SiBC film), a silicon film (Si film), a germanium film (Ge film), and a silicon germanium film (SiGe film), films containing metal elements, such as a titanium nitride film (TiN film), a tungsten film (W film), a molybdenum film (Mo film), a ruthenium film (Ru film), a cobalt film (Co film), a nickel film (Ni film), and a copper film (Cu film), an amorphous carbon film (a-C film), a single crystal Si (Si wafer), etc. Any region (base) may be used as the first surface as long as it is a region (base) on which an inhibitor layer may be formed. On the other hand, any region (base) may be used as the second surface as long as it is a region (base) on which an inhibitor layer is difficult to be formed. Also in these embodiments, the same effects as the above-described embodiments may be obtained.

Further, for example, in the selective growth, in addition to the SiOC film and the SiO film, films containing semiconductor elements such as, a SiON film, a SiOCN film, a SiCN film, a SiC film, a SiN film, a SiBCN film, a SiBN film, a SiBC film, a Si film, a Ge film, and a SiGe film or films containing metal elements, such as a TiN film, a W film, a WN film, a Mo film, a Ru film, a Co film, a Ni film, an Al film, an AlN film, a TiO film, a WO film, a WON film, a MoO film, a RuO film, a CoO film, a NiO film, an AlO film, a ZrO film, a HfO film, and a TaO may be formed. When these films are formed, the same effects as in the above-described embodiments may be obtained.

Recipes used in each process may be provided individually according to the processing contents and may be stored in the memory 121*c* via a telecommunication line or the external memory 123. Moreover, at the beginning of each process, the CPU 121*a* may properly select an appropriate recipe from the recipes stored in the memory 121*c* according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-provided ones but may be provided, for example, by modifying existing recipes that are already installed in the substrate processing apparatus. When the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

Examples in which a film is formed by using a batch-type substrate processing apparatus capable of processing a plurality of substrates at a time are described in the above-described embodiments. The present disclosure is not limited to the above-described embodiments, but may be suitably applied, for example, to a case where a film is formed by using a single-wafer type substrate processing apparatus capable of processing a single substrate or several substrates at a time. In addition, examples in which a film is formed by using a substrate processing apparatus provided with a hot-wall-type process furnace are described in the above-described embodiments. The present disclosure is not limited to the above-described embodiments, but may be suitably applied to a case where a film is formed by using a substrate processing apparatus provided with a cold-wall-type process furnace.

Even in the case of using these substrate processing apparatuses, each process may be performed according to the same processing procedures and process condition as those in the above-described embodiments and modifications, and the same effects as the above-described embodiments and modifications are achieved.

The above-described embodiments and modifications may be used in proper combination. The processing procedures and process conditions used in this case may be the same as, for example, the processing procedures and process conditions in the above-described embodiments and modifications.

Preferred Aspects of Present Disclosure

Hereinafter, preferred aspects of the present disclosure will be additionally described as supplementary notes.

(Supplementary Note 1)

According to another aspect of the present disclosure, there is provided a method of processing a substrate or a method of manufacturing a semiconductor device, including:

(a) supplying a modifying agent to a substrate including a first surface and a second surface to form an inhibitor layer on the first surface and at least a portion of the second surface;

(b) supplying a reactant to the substrate to perform at least one selected from the group of removal and invalidation of the inhibitor layer formed on the at least a portion of the second surface; and (c) supplying a film-forming agent to the substrate to form a film on the second surface.

(Supplementary Note 2)

The method of Supplementary Note 1, wherein the film-forming agent contains a precursor and a reactant, and wherein in (c), a cycle including (c1) supplying the precursor to the substrate and (c2) supplying the reactant to the substrate is performed a predetermined number of times.

(Supplementary Note 3)

The method of Supplementary Note 2, wherein an exposure amount of the reactant to the substrate in (b) is set to be larger than an exposure amount of the reactant to the substrate per cycle in (c).

(Supplementary Note 4)

The method of Supplementary Note 2 or 3, wherein a supply time of the reactant in (b) is set to be longer than a supply time of the reactant per cycle in (c), a supply flow rate of the reactant in (b) is set to be larger than a supply flow rate of the reactant in (c), or the supply time of the reactant in (b) is set to be longer than the supply time of the reactant per cycle in (c), and the supply flow rate of the reactant in (b) is set to be larger than the supply flow rate of the reactant in (c).

(Supplementary Note 5)

The method of any one of Supplementary Notes 1 to 4, wherein a processing pressure in (b) is set to be higher than a processing pressure in (c2), a partial pressure of the reactant in (b) is set to be higher than a partial pressure of the reactant in (c2), or the processing pressure in (b) is set to be higher than the processing pressure in (c2), and the partial pressure of the reactant in (b) is set to be higher than the partial pressure of the reactant in (c2).

(Supplementary Note 6)

The method of any one of Supplementary Notes 1 to 5, wherein (b) is performed under a condition that (b) is more likely to cause at least one selected from the group of removal and invalidation of the inhibitor layer than (c).

(Supplementary Note 7)

According to still another aspect of the present disclosure, there is provided a substrate processing apparatus including:

a process chamber in which a substrate is processed;

a modifying agent supply system configured to supply a modifying agent to the substrate in the process chamber;

a reactant supply system configured to supply a reactant to the substrate in the process chamber;

a film-forming agent supply system configured to supply a film-forming agent to the substrate in the process chamber; and a controller configured to be capable of controlling the modifying agent supply system, the reactant supply system, and the film-forming agent supply system to perform each process (each step) of Supplementary Note 1 in the process chamber.

(Supplementary Note 8)

According to still another aspect of the present disclosure, there is provided a program that causes, by a computer, a substrate processing apparatus to perform each procedure (each step) of Supplementary Note 1, or a non-transitory computer-readable recording medium storing the program.

According to the present disclosure in some embodiments, it is possible to improve a step coverage of a film formed on a substrate by selective growth.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:

(a) supplying a modifying agent to a substrate including a first surface and a second surface to form an inhibitor layer on the first surface and at least a portion of the second surface; and (b) after forming the inhibitor layer on the first surface and the at least a portion of the second surface in (a), forming a film on the second surface by performing a cycle a predetermined number of times without supplying the modifying agent to the substrate, the cycle including (b1) supplying a precursor to the substrate and (b2) supplying a reactant to the substrate, wherein the first surface includes a surface of an oxygen-containing film and the second surface includes a surface of an oxygen-free film, and a region of the second surface where an adsorption site of OH termination for the modifying agent exists is smaller than a region of the first surface where an adsorption site of OH termination for the modifying agent exists, wherein in (b), a process condition per cycle up to an n-th cycle is set to be different from a process condition per cycle on and after an (n+1)-th cycle to shorten an incubation time for forming a film on the second surface, wherein n is an integer of 1 or 2 or more, and wherein in (b), the precursor supplied up to the n-th cycle is a same material as the precursor supplied on and after the (n+1)-th cycle, and the reactant supplied up to the n-th cycle is a same material as the reactant supplied on and after the (n+1)-th cycle.

2. The method of claim 1, wherein in (b), an exposure amount of the reactant to the substrate per cycle up to the n-th cycle is set to be larger than an amount of exposure of the reactant to the substrate per cycle on and after the (n+1)-th cycle.

3. The method of claim 1, wherein in (b), a supply time of the reactant per cycle up to the n-th cycle is set to be longer than a supply time of the reactant per cycle on and after the (n+1)-th cycle, a supply flow rate of the reactant up to the n-th cycle is set to be larger than a supply flow rate of the reactant on and after the (n+1)-th cycle, or the supply time of the reactant per cycle up to the n-th cycle is set to be longer than the supply time of the reactant per cycle on and after the (n+1)-th cycle, and the supply flow rate of the reactant up to the n-th cycle is set to be larger than the supply flow rate of the reactant on and after the (n+1)-th cycle.

4. The method of claim 1, wherein in (b), an exposure amount of the precursor to the substrate per cycle up to the n-th cycle is set to be larger than an exposure amount of the precursor to the substrate per cycle on and after the (n+1)-th cycle.

5. The method of claim 1, wherein in (b), a supply time of the precursor per cycle up to the n-th cycle is set to be longer than a supply time of the precursor per cycle on and after the (n+1)-th cycle, a supply flow rate of the precursor up to the n-th cycle is set to be larger than a supply flow rate of the precursor on and after the (n+1)-th cycle, or the supply time of the precursor per cycle up to the n-th cycle is set to be longer than the supply time of the precursor per cycle on and after the (n+1)-th cycle, and the supply flow rate of the precursor up to the n-th cycle is set to be larger than the supply flow rate of the precursor on and after the (n+1)-th cycle.

6. The method of claim 1, wherein in (b), a processing pressure in (b2) up to the n-th cycle is set to be higher than the processing pressure in (b2) on and after the (n+1)-th cycle.

7. The method of claim 1, wherein in (b), a partial pressure of the reactant in (b2) up to the n-th cycle is set to be higher than a partial pressure of the reactant in (b2) on and after the (n+1)-th cycle.

8. The method of claim 1, wherein in (b), a processing pressure in (b1) up to the n-th cycle is set to be equal to or higher than a processing pressure in (b1) on and after the (n+1)-th cycle.

9. The method of claim 1, wherein in (b), a partial pressure of the precursor in (b1) up to the n-th cycle is set to be equal to or higher than a partial pressure of the precursor in (b1) on and after the (n+1)-th cycle.

10. The method of claim 1, wherein in (b), a supply time of the precursor per cycle up to the n-th cycle is set to be longer than a supply time of the reactant per cycle up to the n-th cycle.

11. The method of claim 1, wherein in (b), a supply time of the reactant per cycle up to the n-th cycle is set to be longer than a supply time of the precursor per cycle up to the n-th cycle.

12. The method of claim 1, wherein in (b), a processing pressure in (b2) on and after the (n+1)-th cycle is set to be equal to or lower than a processing pressure in (b1) on and after the (n+1)-th cycle.

13. The method of claim 1, wherein the number of cycles up to the n-th cycle is set to be smaller than the number of cycles on and after the (n+1)-th cycle.

14. The method of claim 1, wherein the number of cycles up to the n-th cycle is set to be 1 or more and 10 or less.

15. The method of claim 1, wherein in (b), at least one selected from the group of removal and invalidation of the inhibitor layer formed on the at least a portion of the second surface is performed until the n-th cycle.

16. The method of claim 1, wherein the precursor supplied in (b1) is a silicon-and halogen-containing gas.

17. The method of claim 1, wherein the reactant supplied in (b2) is an oxidizing agent.

18. The method of claim 1, wherein the inhibitor layer formed in (a) prevents the precursor from being adsorbed on the first surface in (b).

19. The method of claim 1, wherein a recess is formed on a surface of the substrate, and the first surface and the second surface are alternately arranged on a side surface of the recess.

20. The method of claim 19, wherein a first region of the first surface and a second region, which is different from the first region, of the first surface, are arranged in a depth direction of the recess.

21. A method of manufacturing a semiconductor device, comprising the method of claim 1.

22. A substrate processing apparatus comprising:

a modifying agent supply system configured to supply a modifying agent to a substrate;

a precursor supply system configured to supply a precursor to the substrate;

a reactant supply system configured to supply a reactant to the substrate; and a controller configured to be capable of controlling the modifying agent supply system, the precursor supply system, and the reactant supply system to perform a process including:

(a) supplying the modifying agent to the substrate including a first surface and a second surface to form an inhibitor layer on the first surface and at least a portion of the second surface; and (b) after forming the inhibitor layer on the first surface and the at least a portion of the second surface in (a), forming a film on the second surface by performing a cycle a predetermined number of times without supplying the modifying agent to the substrate, the cycle including:

(b1) supplying the precursor to the substrate; and (b2) supplying the reactant to the substrate, Wherein the first surface includes a surface of an oxygen-containing film and the second surface includes a surface of an oxygen-free film, and a region of the second surface where an adsorption site of OH termination for the modifying agent exists is smaller than a region of the first surface where an adsorption site of OH termination for the modifying agent exists, wherein in (b), a process condition per cycle up to an n-th cycle is set to be different from a process condition per cycle on and after an (n+1)-th cycle to shorten an incubation time for forming a film on the second surface, wherein n is an integer of 1 or 2 or more, and wherein in (b), the precursor supplied up to the n-th cycle is a same material as the precursor supplied on and after the (n+1)-th cycle, and the reactant supplied up to the n-th cycle is a same material as the reactant supplied on and after the (n+1)-th cycle.

23. A non-transitory computer-readable recording medium storing a program that causes, by a computer, a substrate processing apparatus to perform a process comprising:

(a) supplying a modifying agent to a substrate including a first surface and a second surface to form an inhibitor layer on the first surface and at least a portion of the second surface; and (b) after forming the inhibitor layer on the first surface and the at least a portion of the second surface in (a), forming a film on the second surface by performing a cycle a predetermined number of times without supplying the modifying agent to the substrate, the cycle including (b1) supplying a precursor to the substrate and (b2) supplying a reactant to the substrate, wherein the first surface includes a surface of an oxygen-containing film and the second surface includes a surface of an oxygen-free film, and a region of the second surface where an adsorption site of OH termination for the modifying agent exists is smaller than a region of the first surface where an adsorption site of OH termination for the modifying agent exists, wherein in (b), a process condition per cycle up to an n-th cycle is set to be different from a process condition per cycle on and after an (n+1)-th cycle to shorten an incubation time for forming a film on the second surface, wherein n is an integer of 1 or 2 or more, and wherein in (b), the precursor supplied up to the n-th cycle is a same material as the precursor supplied on and after the (n+1)-th cycle, and the reactant supplied up to the n-th cycle is a same material as the reactant supplied on and after the (n+1)-th cycle.

* * * * *